(12) United States Patent
Rastegar et al.

(10) Patent No.: US 8,062,237 B2
(45) Date of Patent: *Nov. 22, 2011

(54) DEVICE FOR GENERATING POWER ACROSS A JOINT

(75) Inventors: Jahangir S. Rastegar, Stony Brook, NY (US); Thomas Spinelli, Northport, NY (US); David Haarhoff, Hicksville, NY (US)

(73) Assignee: Omnitek Partners LLC, Ronkon Koma, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 12/684,965

(22) Filed: Jan. 10, 2010

(65) Prior Publication Data

US 2010/0160121 A1    Jun. 24, 2010

Related U.S. Application Data

(62) Division of application No. 11/201,574, filed on Aug. 11, 2005, now Pat. No. 7,645,246.

(60) Provisional application No. 60/600,456, filed on Aug. 11, 2004.

(51) Int. Cl.
*A61H 1/00* (2006.01)

(52) U.S. Cl. ............. 601/5; 601/23; 601/33; 482/51

(58) Field of Classification Search .......... 482/2, 51, 482/1, 121, 122, 124, 127, 128; 601/5, 23, 601/33, 27, 29, 31, 32, 34, 35
See application file for complete search history.

(56) References Cited

U.S. PATENT DOCUMENTS

| | | | |
|---|---|---|---|
| 6,768,246 B2 * | 7/2004 | Pelrine et al. ............. 310/339 |
| 7,056,297 B2 * | 6/2006 | Dohno et al. ............. 601/48 |
| 7,390,309 B2 * | 6/2008 | Dariush ............. 601/5 |
| 7,445,606 B2 * | 11/2008 | Rastegar et al. ............. 601/5 |
| 7,645,246 B2 * | 1/2010 | Rastegar et al. ............. 601/5 |
| 7,652,386 B2 * | 1/2010 | Donelan et al. ............. 290/1 R |
| 7,659,636 B2 * | 2/2010 | Donelan et al. ............. 290/1 R |
| 7,731,670 B2 * | 6/2010 | Aguirre-Ollinger et al. ...... 601/5 |
| 2006/0046909 A1 * | 3/2006 | Rastegar et al. ............. 482/91 |
| 2006/0260620 A1 * | 11/2006 | Kazerooni et al. ............. 128/845 |
| 2007/0016329 A1 * | 1/2007 | Herr et al. ............. 700/250 |
| 2007/0050044 A1 * | 3/2007 | Haynes et al. ............. 623/24 |
| 2007/0056592 A1 * | 3/2007 | Angold et al. ............. 128/845 |
| 2007/0233279 A1 * | 10/2007 | Kazerooni et al. ............. 623/24 |
| 2010/0076346 A1 * | 3/2010 | Abel et al. ............. 600/592 |

* cited by examiner

*Primary Examiner* — Loan Thanh
*Assistant Examiner* — Victor K Hwang

(57) ABSTRACT

A device for generating power during a locomotion cycle from mechanical energy of a living body. The device including an energy absorbing and converting device disposed across a joint of the living body, the energy absorbing and converting device configured to be selectively in an engaged state and in a disengaged state during selected portions of the locomotion cycle while the device remains disposed across the joint of the living body, wherein the device is engaged to absorb mechanical energy of the living body only during a portion of the locomotion cycle during which muscles of the joint would otherwise be doing work across the joint to absorb mechanical energy of the living body, the device is disengaged during a portion of the locomotion cycle during which the muscles are doing work across the joint to increase mechanical energy of the living body and at least partially converting the absorbed mechanical energy to converted energy and the converted energy is provided to one of an energy storage device or power consuming device.

1 Claim, 24 Drawing Sheets

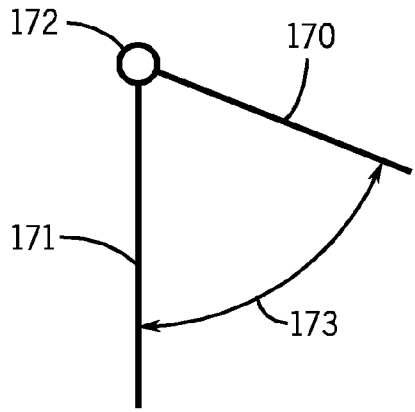
FIG. 14
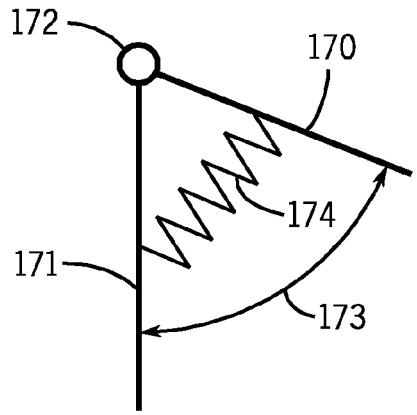
FIG. 15
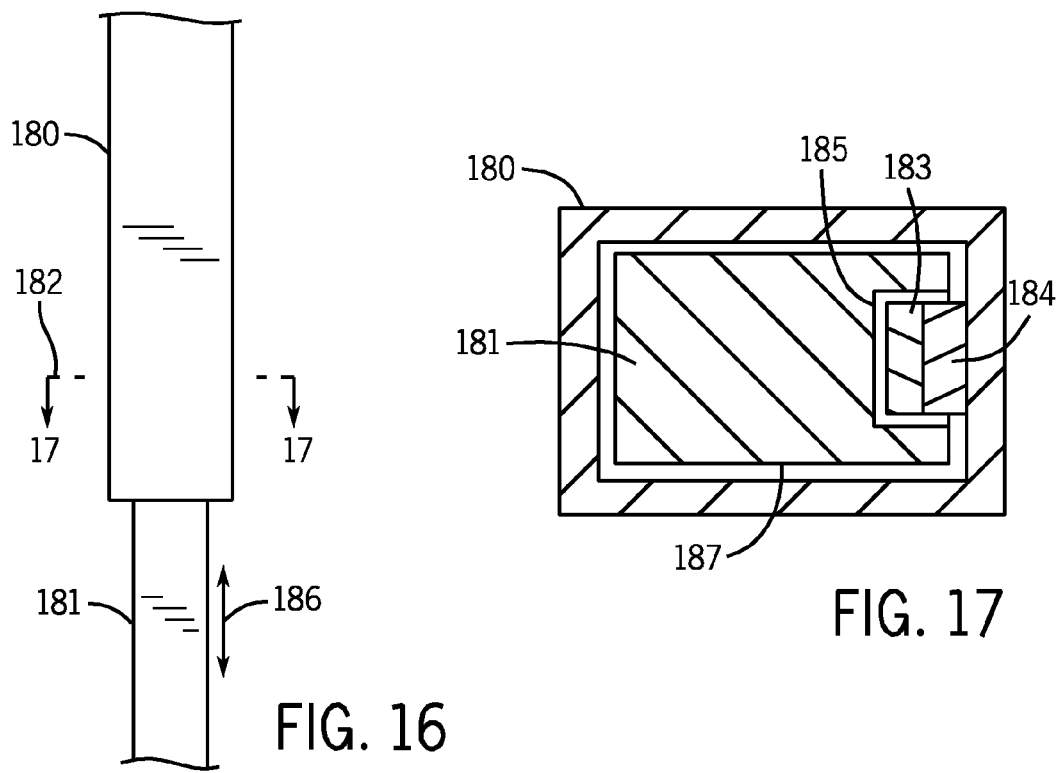
FIG. 16
FIG. 17

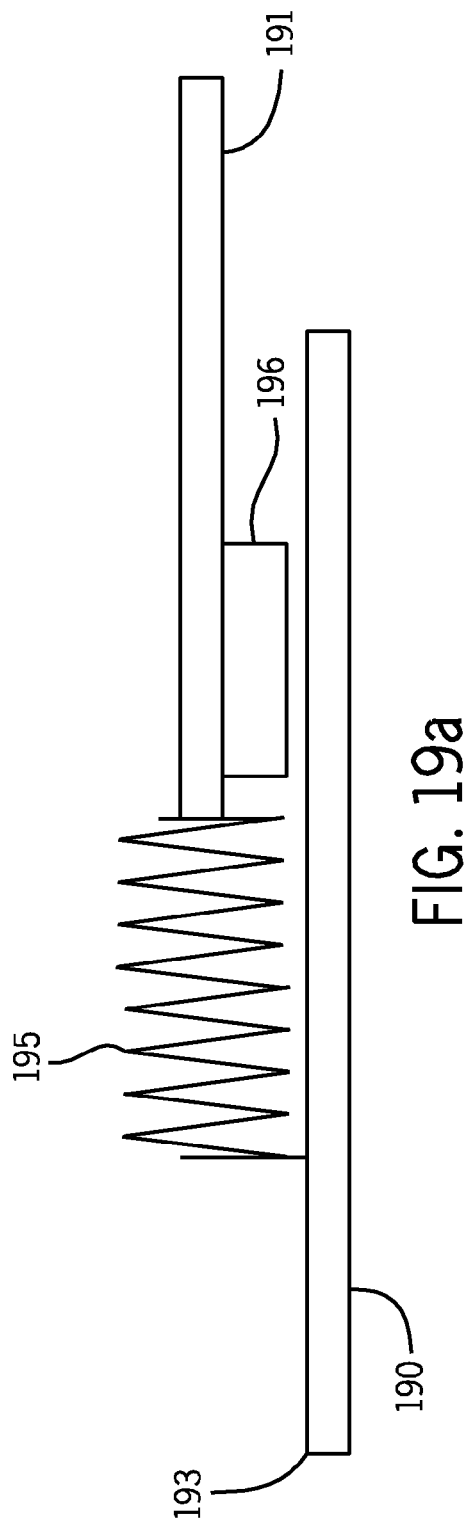
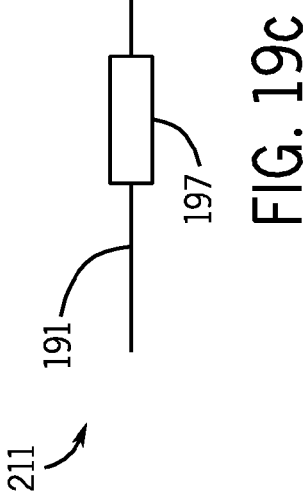
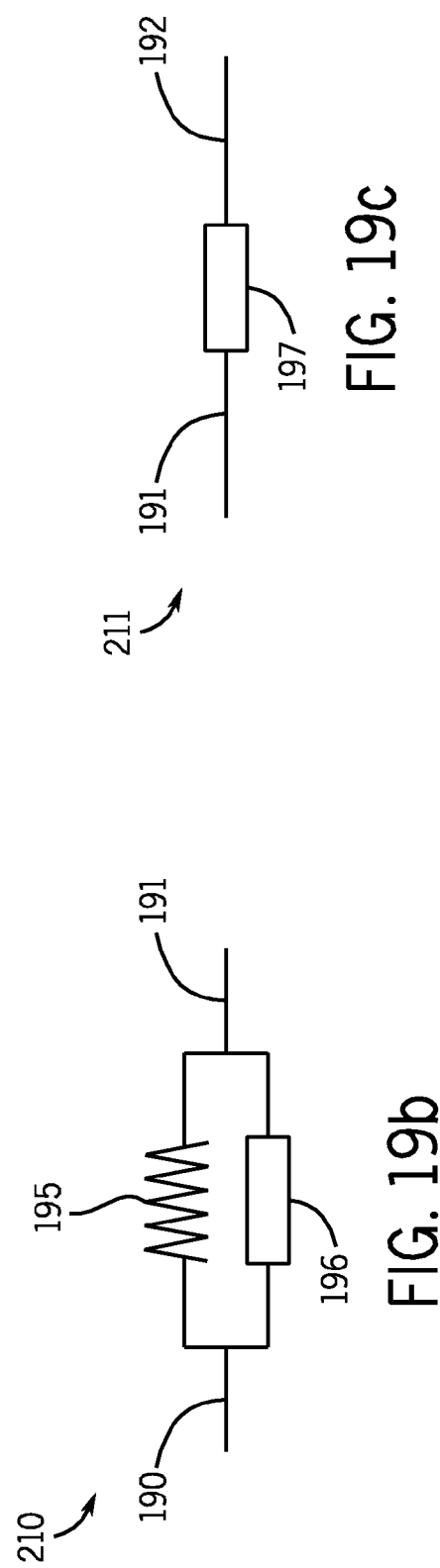

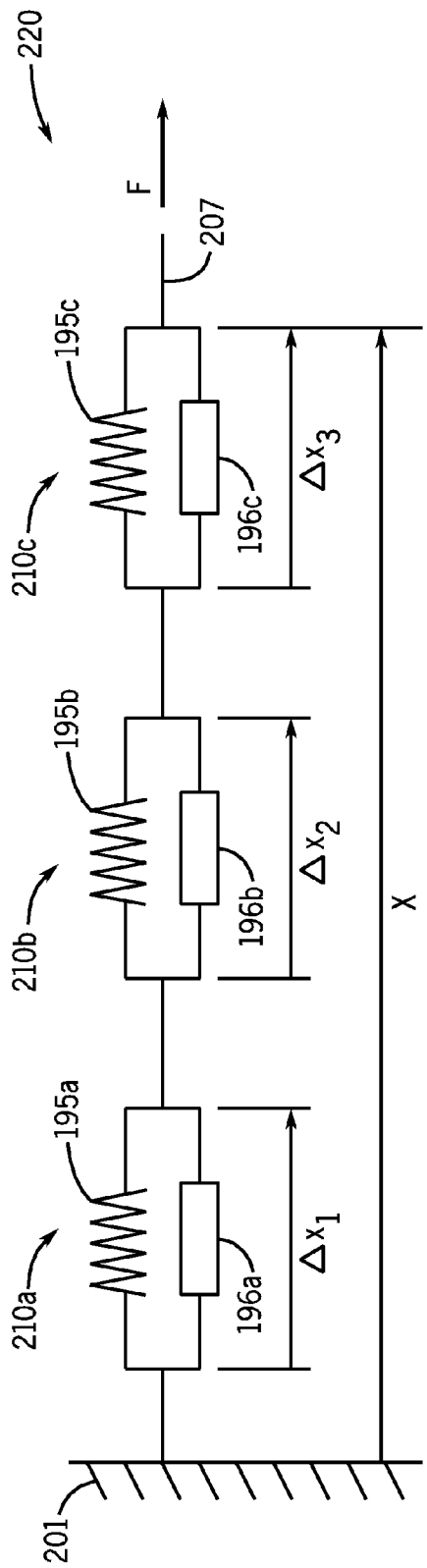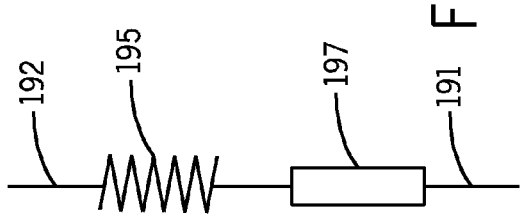
FIG. 20a
FIG. 20b

DEVICE FOR GENERATING POWER ACROSS A JOINT

CROSS-REFERENCE TO RELATED APPLICATION

This application is a divisional application of U.S. application Ser. No. 11/201,574 filed on Aug. 11, 2005, now U.S. Pat. No. 7,645,246, which claims priority to U.S. provisional application Ser. No. 60/600,456 filed on Aug. 11, 2004, the entire contents of each of which is incorporated herein by its reference.

BACKGROUND OF THE INVENTION

1. Field of the Invention

The present invention relates generally to walk-assist and power generation devices and methods, and more particularly, to devices, which generate power and/or assist movement when worn.

2. Prior Art

During walking on a flat, rigid and horizontal surface, a human subject spends energy and tires. On the other hand, if the human subject were instead riding a bicycle that is in good condition, the subject has to spend a significantly less amount of energy to travel the same amount of distance. And in general, the faster the person walks (or runs), the difference between the amount of energy that has to be spent to travel a certain distance on foot or on bicycle becomes greater. The reason for this significant difference in the amount of energy that a person has to spend to travel a certain amount of distance can be described as follows. Here, the objective is to account for the major sources of energy expenditure and for the secondary and generally less significant but complex processes that demand energy expenditure during locomotion.

During normal walking (gait), there are two main sources of energy expenditure. Firstly, due to the structure of the human body, energy is spent to sequentially accelerate and decelerate the lower limbs and to a lesser degree certain other parts of the body (e.g., pumping arms) to achieve locomotion. This component of the energy spend by a person during the process of locomotion is hereinafter called the "locomotion energy". This is the case even during a highly efficient mode of locomotion along a straight path in which the trunk moves at a nearly constant velocity. During normal walking, the motion of the lower limb is nearly periodic. During each cycle of gait, the muscles acting on the lower limbs are responsible for both accelerating and decelerating the limb segments. The muscles consume energy to apply the forces required to accelerate the limb segments and they consume energy to apply the forces required to decelerate the limb segments. In comparison, if the person were riding a bicycle, following initial acceleration to a constant travel velocity, the person has to provide minimal energy to the human-bicycle system since no significant inertia has to be sequentially accelerated and decelerated (neglecting the small friction forces, aerodynamic drag, etc.).

Secondly, muscle forces have to provide the required forces across the various joints of the lower extremities and the back and neck to keep the body upright (or on the seat of the bicycle) and to provide for a stable posture. Thereby the person has to spend energy to provide such muscle forces. This component of the energy spent by a person during the process of locomotion is hereinafter called the "stance energy". The amount of energy required for this purpose is usually significantly higher than the required minimum since the muscle groups generally act together and provide opposing (isometric) forces that provide joint preloads that in turn provide for extra stability margin.

Thus, in order to more significantly reduce the amount of energy that a person has to spend during locomotion, the amount of aforementioned "locomotion energy" and "stance energy" that is consumed by the muscles has to be reduced. Currently, certain devices are known in the art that are used to reduce joint loads and/or to reduce muscle forces (mostly in the lower extremities) that are required for stance stability. These devices do reduce the "stance energy", some a very small amount and some slightly more, and are discussed below. There is, however, no device currently available for directly reducing the "locomotion energy".

To provide or supplement muscle forces in achieving a stable stance, various assist or support devices have been developed. Such stance or support assist devices generally help to reduce the muscle forces that are required to keep the body upright and to provide stance (sitting) stability. As a result, such devices also help reduce the aforementioned "stance energy" requirements during locomotion to various degrees. A person may use one or more of such assist or support devices due to the lack of adequate muscle force levels or control due to age, joint disease, soft or hard tissue injury or operation, etc. These devices include various braces, walkers, canes, crutches, and the like. As a result, the forces that the muscles have to provide and the forces across the various joints of the lower extremities are generally reduced. The currently available assist devices may be divided into the following two categories. Here, various shoe inserts, components incorporated into the shoes, etc., are not considered since they are primarily used to modify force distribution on the foot and its joints by providing certain type of interface between the foot and the shoe (ground).

1. Various bracing devices used to bridge one or more joints, for the primary purpose of reducing the load transmitted through the joint. The level of muscle forces that act across the joint to provide joint stability is also reduced, thereby further reducing the joint forces. Depending on the effectiveness of the bracing in providing joint (stance) stability, the "stance energy" is reduced by a certain amount.

2. Various walk assist devices such as walkers, canes, crutches, etc., for the primary purpose of reducing load on one or both lower extremities. When such assist devices are used, other muscles, usually the arm and shoulder and certain upper body muscles, must then provide the forces needed to assist stance stability and locomotion. The person obviously has to spend energy to provide the latter muscle forces. The currently available assist devices do not significantly reduce the total stance energy expended but merely transfer the load from the lower limb muscles to the muscles of the arm and the upper body.

SUMMARY OF THE INVENTION

The present invention provides methods and devices to reduce both "locomotion energy" and the "stance energy". Such methods have been developed e.g., based on the inherent characteristics of gate and the work done by the muscle forces to affect locomotion and stance stability. Based on such methods, devices are disclosed for the following exemplary applications:

1. Methods and devices to reduce "locomotion energy". A number of embodiments are disclosed that provide a wide rage of locomotion energy reduction. Such devices can be simple and totally passive to eliminate smaller portions of the locomotion energy. More complex devices can be used to eliminate larger portions of the locomotion energy. The complexity in the latter devices can be in terms of the mechanisms to be used and the active components and controls that are needed to make them highly effective. By reducing the amount of locomotion energy that the user has to provide during locomotion (walking and running), the user becomes less fatigued. A user may, therefore, use these devices for the purpose of walking while getting less fatigued, or walking or running longer distances or with heavier loads with essentially the same level of induced fatigue. Embodiments with only passive elements and those with active elements and also microprocessor-controlled versions to achieve higher efficiency, adaptability and programmable operation are also disclosed.

2. A modified version of the above methods to reduce "locomotion energy" that allows the conversion of at least a portion of the saved energy to electrical energy which can be stored and/or directly used to power a device. A number of related embodiments are also disclosed. By using the disclosed devices, a user reduces locomotion energy, thereby gets less fatigued during walking and/or running, while at the same time can generate electrical energy that can be used directly or stored for later use. Embodiments with active elements (in addition to the electrical power generation elements and related electronics) to achieve higher efficiency and those operated by programmable microprocessors are also disclosed.

3. A modified version of the above methods to reduce both "locomotion energy" and "stance energy". Embodiments with only passive elements and those with active elements, including those operated by programmable microprocessors are also disclosed. The latter embodiments include those with sensors for measuring a level of stance stability and fatigue to adapt the parameters of the active components of the device.

4. A modified version of the aforementioned methods to reduce "locomotion energy" in which the phases of operation are reversed, i.e., certain levels of accelerating forces are provided to the limbs while the muscle forces are attempting to decelerate them and decelerating forces are provided while the muscle forces are attempting to accelerate the limbs. The forces applied to oppose the action of the muscle forces help the user exercise the affected muscles. The opposing forces are hereinafter called "exercising forces", the energy spent by the user to provide their action is hereinafter called "exercise energy", and such devices are hereinafter "exercising devices". Embodiments that allow selective application of "exercising forces" to exercise one or a group of muscles and to allow the user to vary the level of the exercising forces are also disclosed. Embodiments capable of providing a programmed sequence of "exercising forces" and/or their levels for selected group or groups of muscles are also disclosed.

Embodiments are also disclosed in which the above "exercising devices" are modified to reduce certain joint contact, ligament or muscle forces. The reductions are achieved by reducing "locomotion energy", and/or the "stance energy", and/or a certain muscle or muscle group forces, and/or the forces transmitted across certain joint or joints. Such embodiments are intended mainly for physical therapy and rehabilitation purposes by providing means to adjust the level of muscle, ligament or joint contact forces. Embodiments capable of providing a programmable variation of the aforementioned forces are also disclosed.

Accordingly, a method for generating power from an exerted energy associated with muscles acting across a joint is provided. The method comprising: absorbing energy during one or more periods of a periodic motion of the joint in which energy is absorbed by the muscles; and at least partially returning the absorbed energy to one of an energy storage device or power consuming device.

The method can further comprise returning any absorbed energy not returned to the energy storage device or power consuming device to the muscles during one or more periods of the periodic motion in which the muscles are performing work.

The method can further comprise storing any absorbed energy not returned to the energy storage device or power consuming device and returning the stored energy to the muscles during one or more periods of the periodic motion in which the muscles are performing work.

The joint can be one or both of the ankle and knee.

The periodic motion can be one of walking and running.

The absorbing of energy can be done in a mechanical device.

The absorbed energy can be converted to one of an electrical energy, heat energy, and mechanical energy.

Also provided is a device for generating power from an exerted energy associated with muscles acting across a joint. The device comprising: an energy absorbing element for absorbing energy during one or more periods of a periodic motion of the joint in which energy is absorbed by the muscles; and means for at least partially returning the absorbed energy to one of an energy storage device or power consuming device.

The device can further comprise returning any absorbed energy not returned to the energy storage device or power consuming device to the muscles during one or more periods of the periodic motion in which the muscles are performing work.

The device can further comprise storing any absorbed energy not returned to the energy storage device or power consuming device and returning the stored energy to the muscles during one or more periods of the periodic motion in which the muscles are performing work.

The joint can be one or both of the ankle and knee.

The periodic motion can be one of walking and running.

The energy absorbing element can be a mechanical device.

The device can further comprise means for converting the absorbed energy to one of an electrical energy, heat energy, and mechanical energy.

Still further provided is a device for generating power from a locomotion energy associated with leg muscles acting across an ankle joint. The device comprising: a cuff worn on the leg; a shoe; an energy absorbing element operatively connected to the cuff and shoe for absorbing energy during one or more periods of a periodic motion of the joint in which energy is absorbed by the muscles; and means for at least partially returning the absorbed energy to one of an energy storage device or power consuming device.

The energy absorbing element can comprise: a first intermediate member attached to the shoe; a second intermediate member attached to the cuff, the first and second intermediate parts being rotatably connected at a hinge; an elastic member connected to the first and second intermediate members such that the elastic member stretches during the one or more periods of the walking or running motion of the joint in which energy is absorbed by the muscles and relaxes during the one or more periods of the walking or running motion in which the muscles are performing work; and a power generator operatively connected to the elastic member for generating power when the elastic member stretches.

The power generator can be a piezo generator. The piezo generator can comprise a stack of bending elements each having a piezo material associated therewith such that the bending members deform upon stretching of the elastic member to generate an electrical power in the corresponding piezo materials.

The means for at least partially returning the absorbed energy to one of an energy storage device or power consuming device can comprise electrical collection and regulation means.

BRIEF DESCRIPTION OF THE DRAWINGS

These and other features, aspects, and advantages of the apparatus and methods of the present invention will become better understood with regard to the following description, appended claims, and accompanying drawings where:

FIG. 14 illustrates a schematic of two relatively rigid links and attached by a rotary joint.

FIG. 15 illustrates a schematic of the two links of FIG. 14 with an added elastic (spring) element.

FIG. 16 illustrates a sliding joint having a braking element that allows relative displacement of two relatively rigid components.

FIG. 17 illustrates a section view of the sliding joint of FIG. 16 as taken along line 17-17 of FIG. 16.

FIG. 19a illustrates the links of FIG. 18. FIG. 19b is a diagram showing links 190 and 191 and of FIG. 19a and FIG. 19c is a diagram showing links 191 and 192.

FIG. 20a illustrates a schematic showing three elements connected in series and FIG. 20b illustrates a brake element and spring element connected in series.

FIG. 21 illustrates a plot of the force versus displacement for the three elements connected in series of FIG. 20a.

In FIG. 23a, the piezo generator is attached to the elastic element with a parallel configuration. In FIG. 23b, the piezo generator is attached in series to the elastic element.

FIGS. 24b and 24c illustrates bending elements of the piezo generator of FIG. 24a.

DETAILED DESCRIPTION OF THE PREFERRED EMBODIMENT

The present invention provides methods and devices to reduce "locomotion energy" and/or "stance energy", or obtain other novel variations as enumerated above. As it is described below, the disclosed novel method is based on the inherent characteristics of gate and the work done by the muscle forces to affect locomotion and stance stability. In this disclosure, for the sake of simplicity, this method is first described by its application to a device for the human knee, which allows the user to reduce the component of the "locomotion energy" associated with the muscles acting across the knee joint during locomotion (walking or running). It is then shown how the muscle forces required for stance stability across the knee joint can also be reduced. The method is general and applicable to the other joints of the subject, both individually and as a group. The method also applies to other linear and/or rotational motion of other segments of the body. The description of the aforementioned related methods and devices and their various embodiments are provided next.

Figure 1:
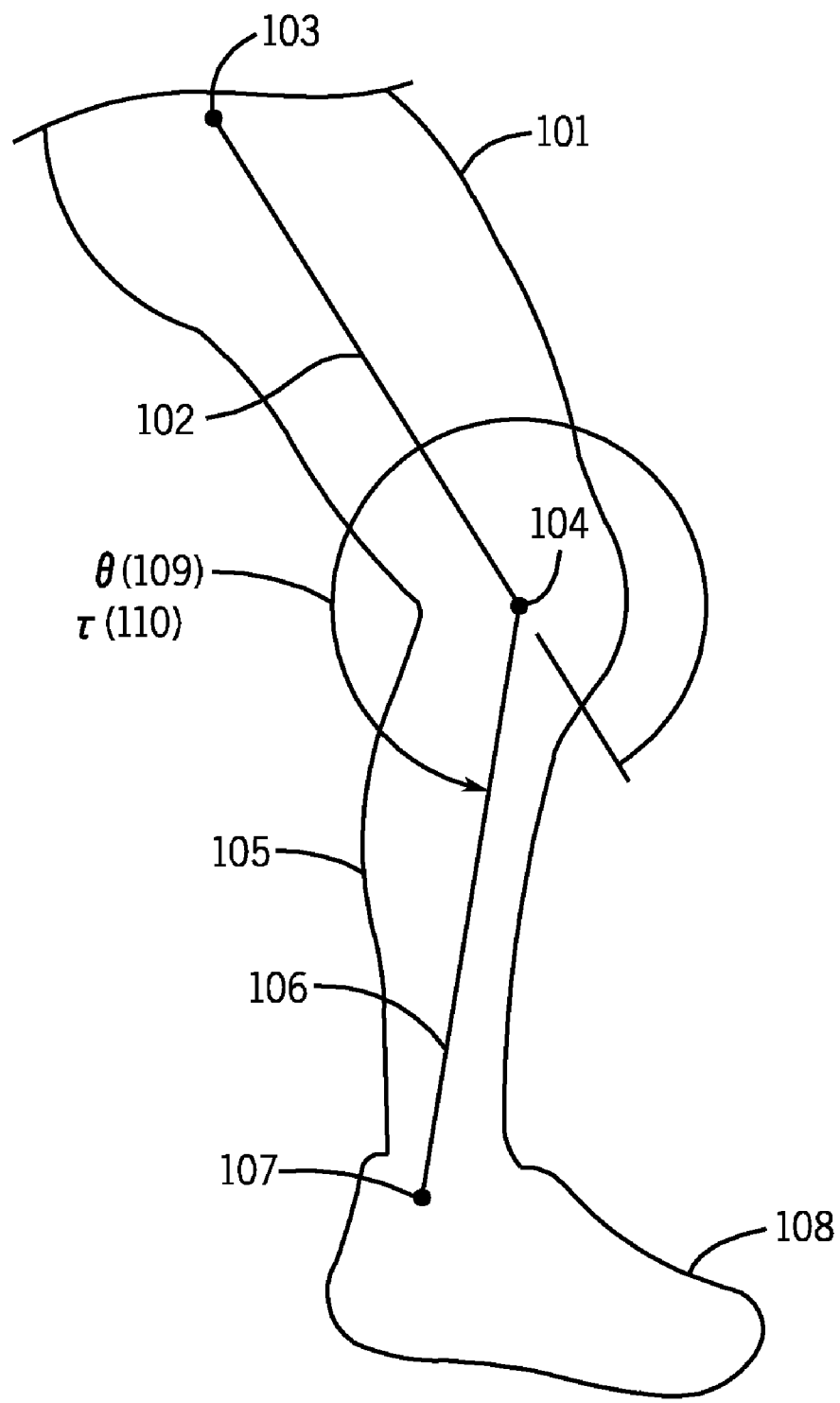
FIG. 1 illustrates a schematic of a lateral view of a right leg.

A schematic of the lateral view of a right leg is shown in FIG. 1. For the sake of simplicity it is assumed that locomotion is occurring in a fixed vertical plane and is represented by a simple model. The thigh 101 is modeled as a link 102 connected to the trunk (not shown) and the knee by rotary joints 103 and 104, respectively. Similarly, the lower leg 105 is modeled as a link 106 connected to the knee joint 104 and an ankle joint 107. The foot is indicated by reference numeral 108 and is also connected to the ankle joint 107. In this simple model, the angle $\theta$ (109) between the thigh 102 and the leg 106 is essentially between the femur (link 102) and the tibia (link 106) in the direction shown in FIG. 1, and is hereinafter referred to as the knee angle.

The torque $\tau$ (110) is the total torque produced by the muscles acting on the knee joint 104 to produce or maintain the angle $\theta$ (109). The torque $\tau$ (110) is hereinafter referred to as the knee torque or knee moment.

The net mechanical power P at any given point of time due to the torque $\tau$ (110) acting at the knee joint rotating with the angular velocity $V_\theta$ is given by:

$$P = \tau V_\theta \quad (1)$$

In periods in which the power P, equation (1), is positive, the knee torque and angular velocity have the same sense and the input of energy by the leg muscles into the (leg) system at the knee joint 104 is positive. On the other hand, when the power P is negative, the leg muscles are taking energy out of the (leg) system, i.e., are absorbing energy. In either case, the muscles spend energy, and as a result, the subject gets fatigued. In general, if the subject is walking on a horizontal surface, the above energy consists mostly of kinetic energy.

In any range of angular rotation, the mechanical work U done by the knee torque τ can be found directly by integrating the product of the torque and angular rotation over the specified range of knee motion. Alternatively, the mechanical work U over an interval of time may be determined by integrating the power P, equation (1), over the specified interval of time as:

$$U = \int_{t_{initial}}^{t_{final}} P dt \qquad (2)$$

Consider a subject walking with a fixed cyclic gate. The kinematics and dynamics of such cyclic gates for humans have been extensively studied and reported in the published literature, such as in Bresler, B., Frankel, J. P., "The forces and moments in the leg during level walking," Trans. ASME 72:27-36 (1950); Cappozzo, A., Leo, T., Pedotti, A., "A general computing method for the analysis of human locomotion," J. Biomechanics, 8:307-320 (1975); Chao, E. Y., "Justification of triaxial goniometer for the measurement of joint rotation," J. Biomechanics, 13:989-1006 (1980); David A. Winter, The Biomechanics and Motor Control of Human Gait Normal, Elderly and Pathological, Second Edition, University of Waterloo Press (1991); and Winter, D. A., Sidwall, H. G., Hobson, D. A., "Measurement and reduction of noise in kinematics of locomotion," J. Biomechanics, 7:157-159 (1974).

Figure 2A:
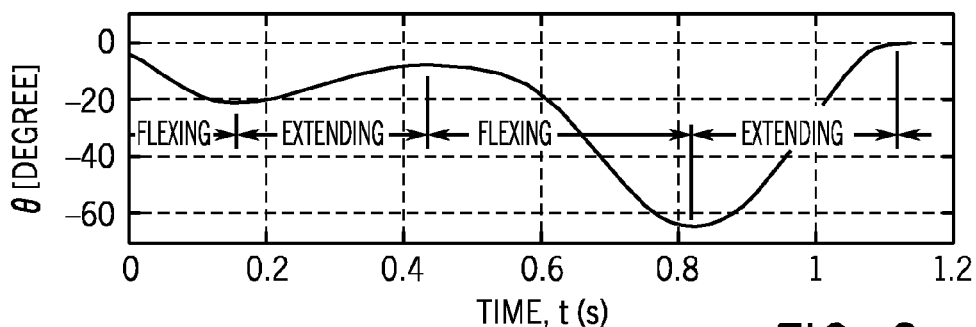
FIGS. 2a-2d illustrate graphs showing measurements of average lower extremity joints motion and the required net muscle induced torques for a 80 kg male.

For example, measurements of average lower extremity joints motion and the required net muscle induced torques are presented in FIGS. 2a-2d for an 80 kg male. The average rotation at the knee joint 104 during the "stride period" of a natural "cadence" is shown in FIG. 2a, with the intervals in which the knee is extending (straightening) and flexing (bending) clearly indicated. "Stride Period" is defined as the time between two consecutive initial contacts between the right heel and the ground during natural walking "Cadence" is the number of steps per unit time. Natural Cadence is the number of steps per unit time when the person is walking at their natural pace.

Figure 2B:
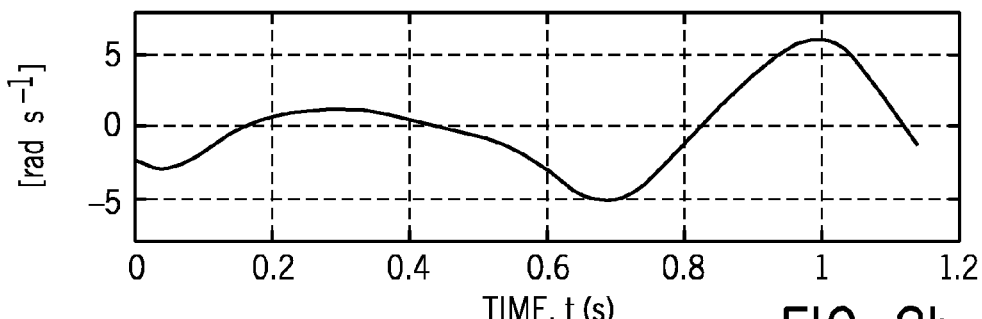
Figure 2C:
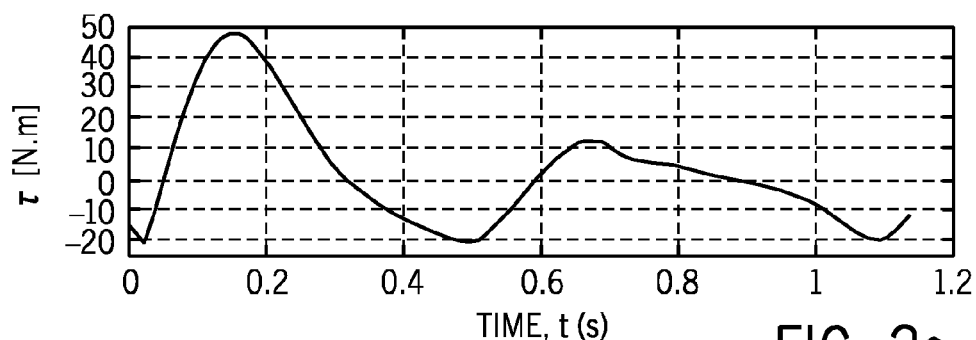

The corresponding angular velocity of the knee $V_\theta$ and knee torque τ are also shown in FIGS. 2b and 2c, respectively. The corresponding power P is shown in FIG. 2d.

Figure 2D:
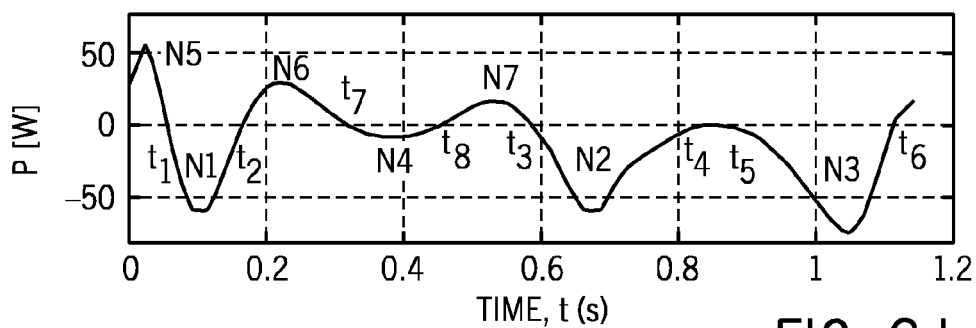

As can be seen in FIG. 2d, there are four intervals, labeled as N1 (from time $t_1$ to time $t_2$), N2 (from time $t_3$ to time $t_4$), N3 (from time $t_5$ to time $t_6$), and N4 (from time $t_7$ to time $t_8$), within which the input power is negative. During the intervals N1, N2, N3 and N4, the leg muscles, as a whole, are absorbing energy and the knee torque (moment) and angular velocity are in opposing directions. In the other intervals N5 (from time $t_6$ to time $t_1$), N6 (from time $t_2$ to time $t_7$) and N7 (from time $t_8$ to time $t_3$), however, the muscles are doing work to mostly add to the kinetic and potential energy of the leg system. During locomotion, muscle forces in a similar manner act on other lower extremity joints (and to a lesser degree other body segments) to accelerate and then to decelerate them during each cycle of gate (in certain cases, e.g., at the knee joint 104, several such intervals are present during each cycle of gait). In addition, the muscle forces also do work to raise certain segments of the body, for example the foot and the leg, thereby increasing and later decreasing their potential energy. It is also noted that many muscles act on more than one joint and that different segments of the body, e.g., the lower extremities, undergo a more complex pattern of simultaneous motions.

Now consider the case in which the energy to be absorbed during the intervals N1, N2, N3 and N4 is stored in certain mechanical (or electrical) storage devices and partially or wholly returned to the leg system during the N5, N6 and N7 intervals to partially or wholly eliminate the need for the leg muscles to input the required energy during the latter intervals. In a similar manner, the energy absorbed by the muscle forces acting across other joints such as ankle and the hip joints may be stored (as electrical energy and/or mechanical energy) and returned to the leg system when the muscle forces are required to provide energy to the affected body segments.

Such a device is a walk-assist device that significantly reduces the amount of work that the leg muscles have to do during walking or running, i.e., it would significantly reduce the aforementioned "locomotion energy". As a result, the walk-assist device significantly reduces the amount of work that the leg muscles have to do during walking or running.

In fact, if a subject is walking on a horizontal surface and if friction losses at the joints, friction losses between the shoes and the ground, aerodynamic drag on the body, etc., are neglected, it is theoretically possible to totally eliminate the aforementioned "locomotion energy". This can be done using the aforementioned method to construct a walk-assist device that operates simultaneously across all the joints of the lower extremities, storing e.g., mechanical energy that the muscles have to provide to absorb kinetic and/or potential energy from the limbs and providing the stored mechanical energy to the limbs when they need to increase their kinetic and/or potential energy. Such a system can operate across all the joints of the lower extremities. The subject using such a device need only provide "stance energy" and energy to overcome dissipation of energy due to friction, aerodynamic drag, etc., similar to when the subject rides a bicycle on a flat horizontal surface.

In general, and is shown in FIG. 2d, the input work by the leg muscles as a function of angular rotation of the knee and therefore time has a complex profile. Thus, the resulting walk-assist devices can require mechanisms with mechanical elements such as brakes and clutches and sensors and control units to allow the device to take full advantage of the available energy during different intervals of the locomotion. However, totally passive devices that would eliminate at least part of the work that the leg muscles have to do during walking or running are also possible. The subject using such a walk-assist device can then walk while spending less energy, thereby getting less tired. Alternatively, the subject can walk longer distances or for longer periods of times without getting more tired than he/she would for a shorter distance without the present device. In addition, as it is shown later in this disclosure, simple modification of such walk-assist devices would allow them to also support the static and dynamic loads due to the weight of the user and the load that is being carried by the user. As a result, the "stance energy" that the user has to spend is also significantly reduced. Such a walk-assist device would then allow the user to walk while spending even less energy, or to walk longer distances and/or to carry heavier loads.

Methods and Devices to Reduce "Locomotion Energy"

The application of the aforementioned basic method to the development of walk-assist devices for the ankle joint to reduce the "locomotion energy" is now described. The method is, however, general and applicable to other joints of the lower extremity and to walk-assist devices extending across more than one joint. The method also applies to other periodic linear and/or rotational motion of other segments of the body during walking and/or running. For such periodic linear and/or rotational motions, devices that operate in a manner similar to those for the lower extremity joints can be constructed to reduce the amount of mechanical energy that the related muscles have to provide during walking or running.

Figure 3:
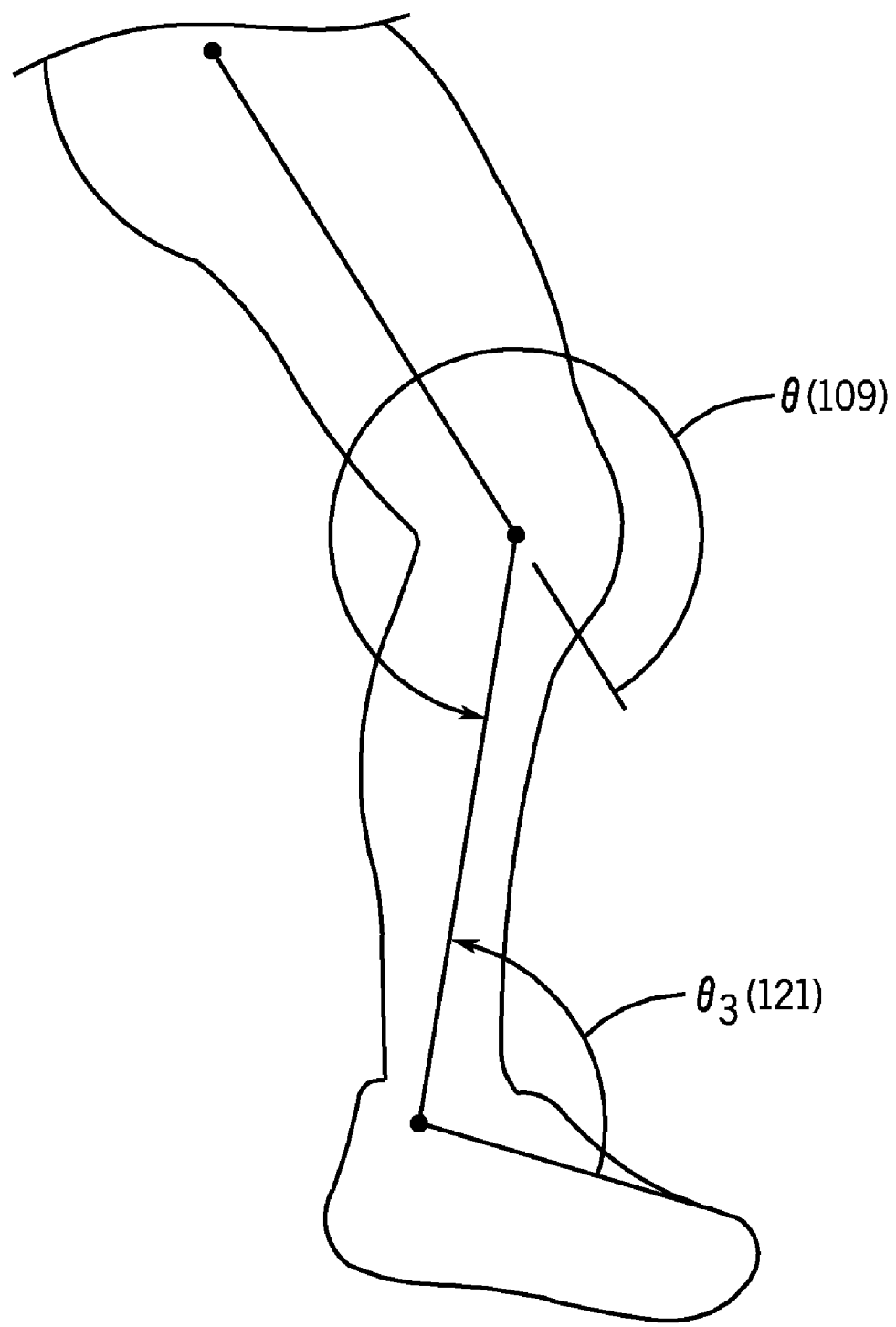
FIG. 3 illustrates a schematic of a right leg, indicating the ankle joint angle $\theta_3$ as measured from the foot to the leg.

FIG. 3 shows the schematics of a right leg, indicating the ankle joint angle $\theta_3$ (121), as measured from the foot to the leg. The plots of the relative joint angle $\theta_3$ (121), the corresponding joint angular velocity $\omega_3$, the net moment of force acting on the ankle joint $M_A$ and the corresponding mechanical power $P_A$ during normal gait as a function of the stride can be obtained from the known methods of the prior art and are shown in FIGS. 4a-4d, respectively. The stride begins at heel contact, HC, and continues until the next consecutive heel contact of the same foot. Toe off, TO, occurs after about 0.64 of the stride and is indicated by the dashed vertical line. The first 0.64 of the stride represents a stance phase for the leg, while the remainder of the stride represents a swing phase.

Figure 4A:
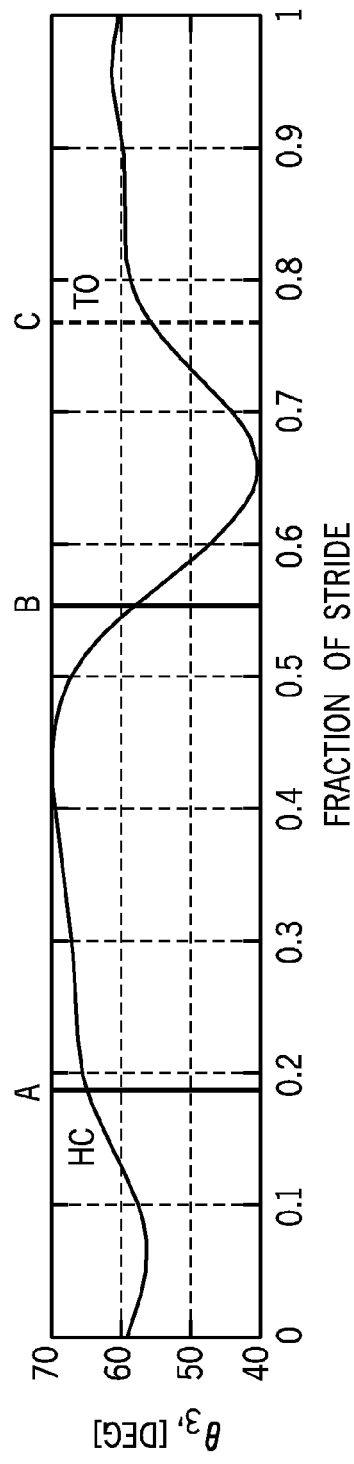
FIG. 4a-4d illustrate plots of the relative joint angle $\theta_3$, the corresponding joint angular velocity $\omega_3$, the net moment of force acting on the ankle joint $M_A$ and the corresponding mechanical power $P_A$, respectively, during normal gait as a function of stride.
Figure 4B:
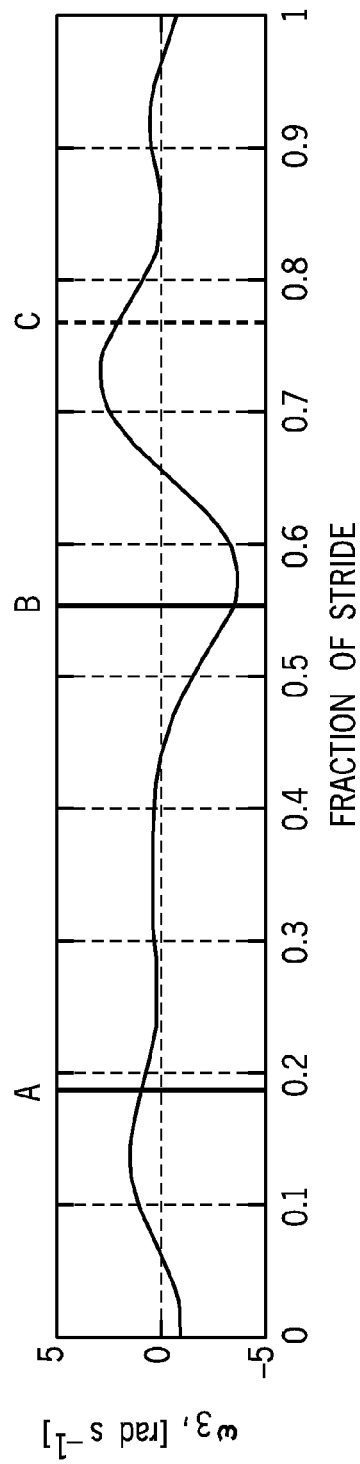
Figure 4C:
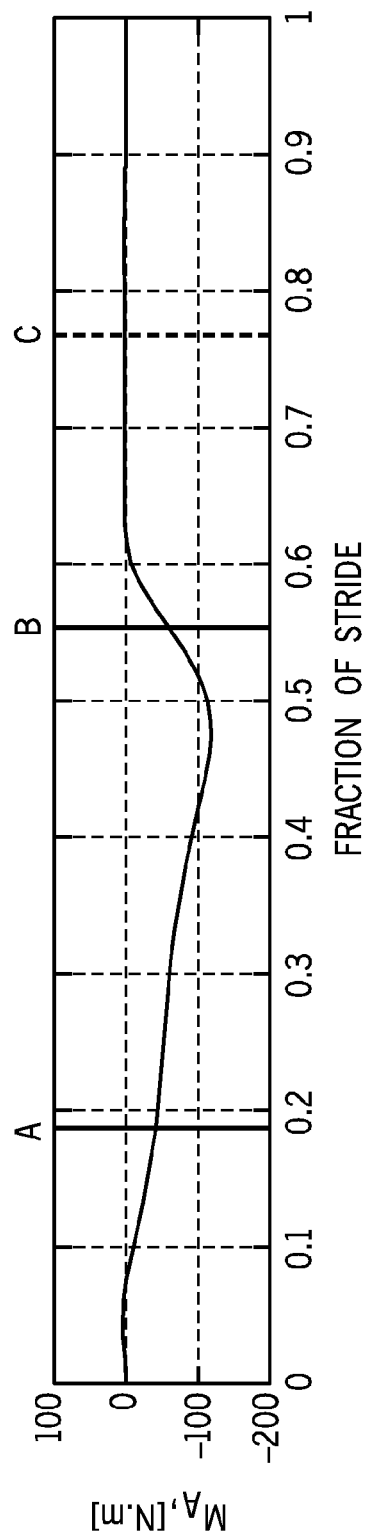
Figure 4D:
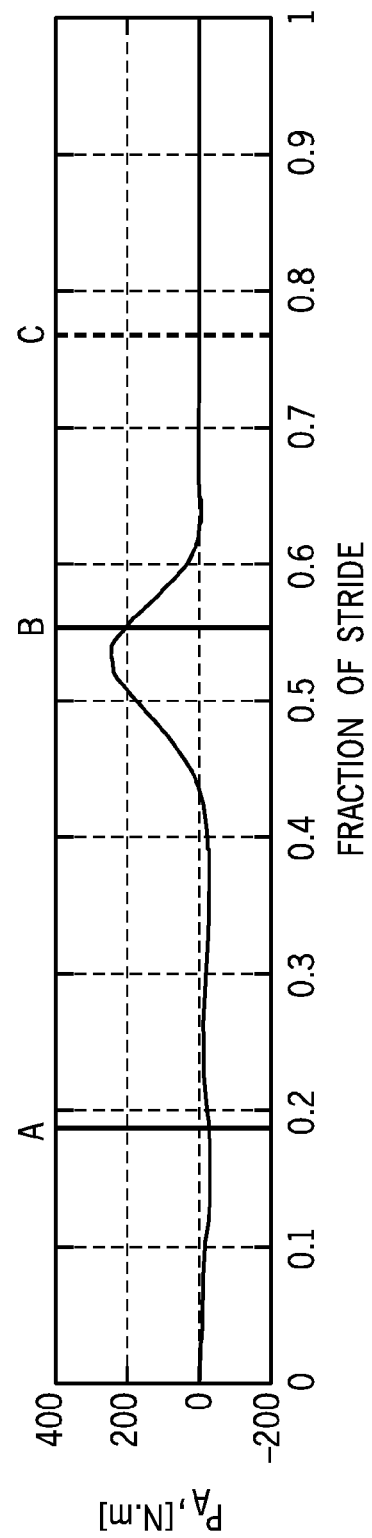

As can be seen in the plot of the mechanical power $P_A$ in FIG. 4d, following the heel contact (point HC), the mechanical power assumes a negative value starting from around the point A and remains negative until the point B (the region between the points A and B are shown bounded between two solid vertical lines). In this region, the mechanical power is negative, i.e. the moment of force and angular velocity have opposite directions. During this interval, the angular velocity $\omega_3$ is always positive (FIG. 4b), indicating that the foot is rotating counterclockwise with respect to the shank. Since the foot is in contact with the ground, one can also picture the foot as being fixed flat on the ground and the shank rotating clockwise relative to the foot. The moment $M_A$ (FIG. 4c) about the ankle joint is negative during this portion of the stride; therefore it has a clockwise direction. Now if the foot is considered to be fixed, the moment $M_A$ is then seen to be acting in a counterclockwise direction, thereby making the mechanical power $P_A$ negative, which means that during this period, the muscles acting on the ankle joint are absorbing energy.

Figure 5:
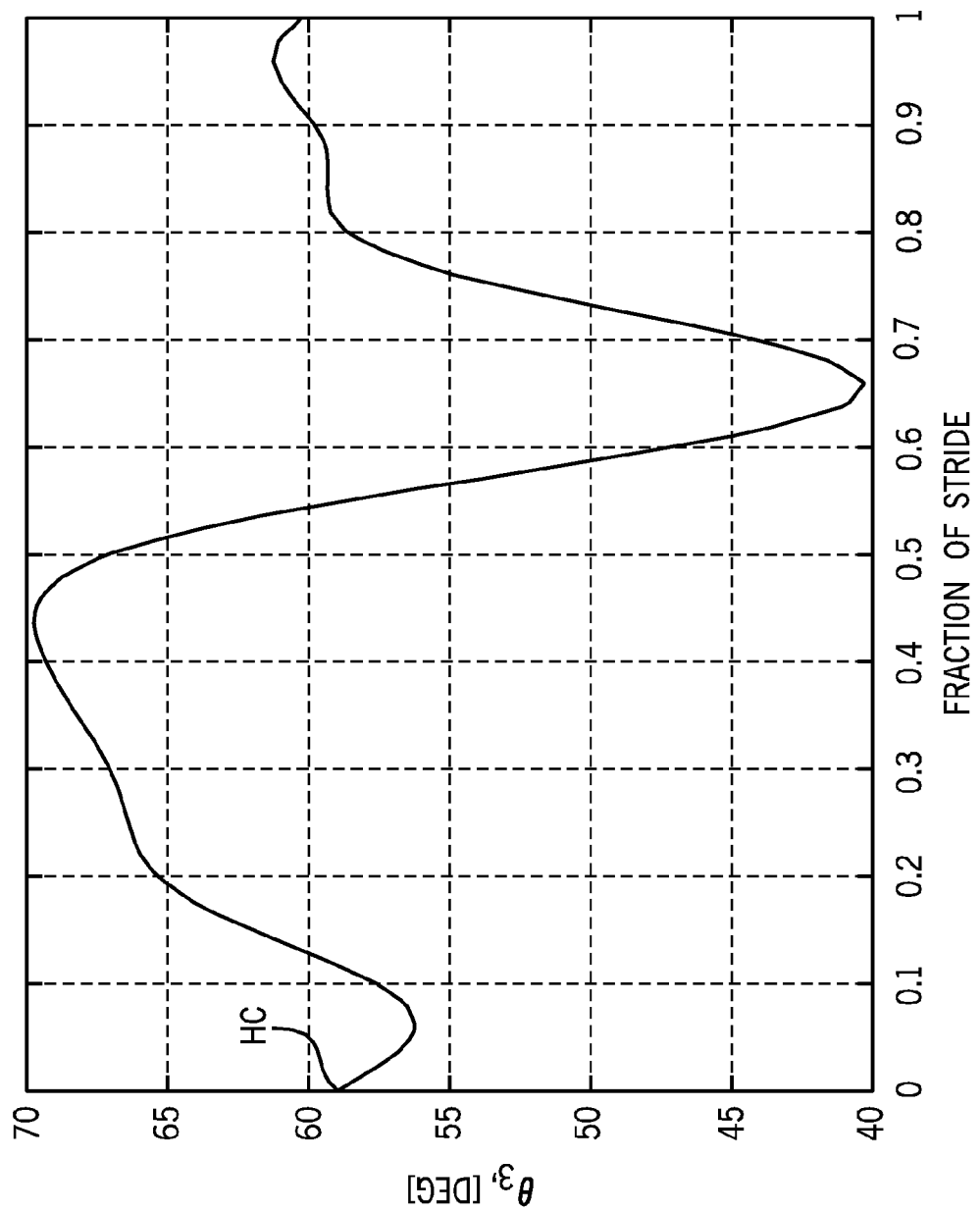
FIGS. 5 and 6 illustrate plots of the ankle joint angle $\theta_3$ and the moment $M_A$ about the ankle joint against during one stride, respectively, from the plots of FIGS. 4a-4d.
Figure 6:
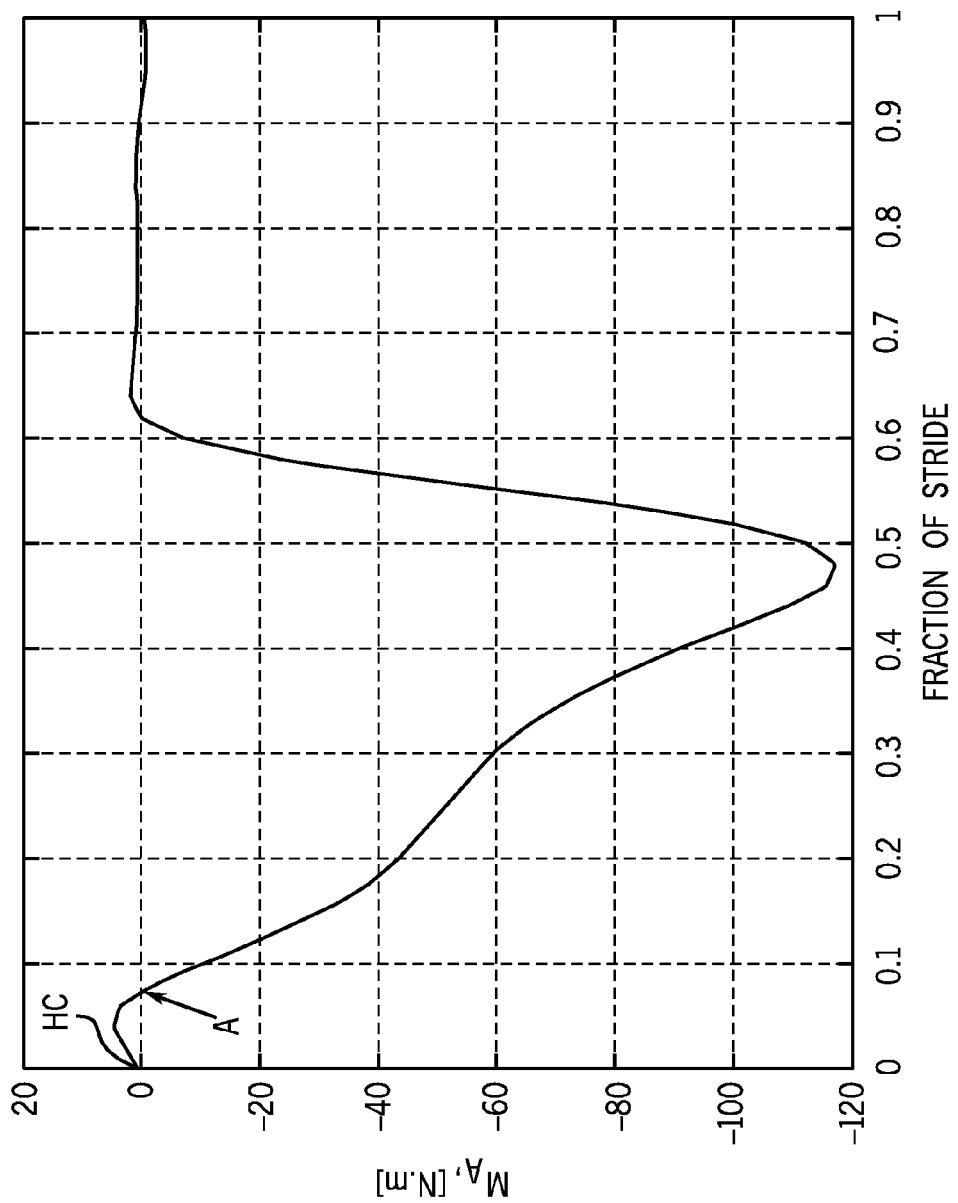

In FIGS. 5 and 6, the plots of the ankle joint angle $\theta_3$ (121) and the moment $M_A$ about the ankle joint against during one stride are shown again from the plots of FIGS. 4a-4d. In FIG. 6, the point A at which the moment $M_A$ is shown.

Figure 7:
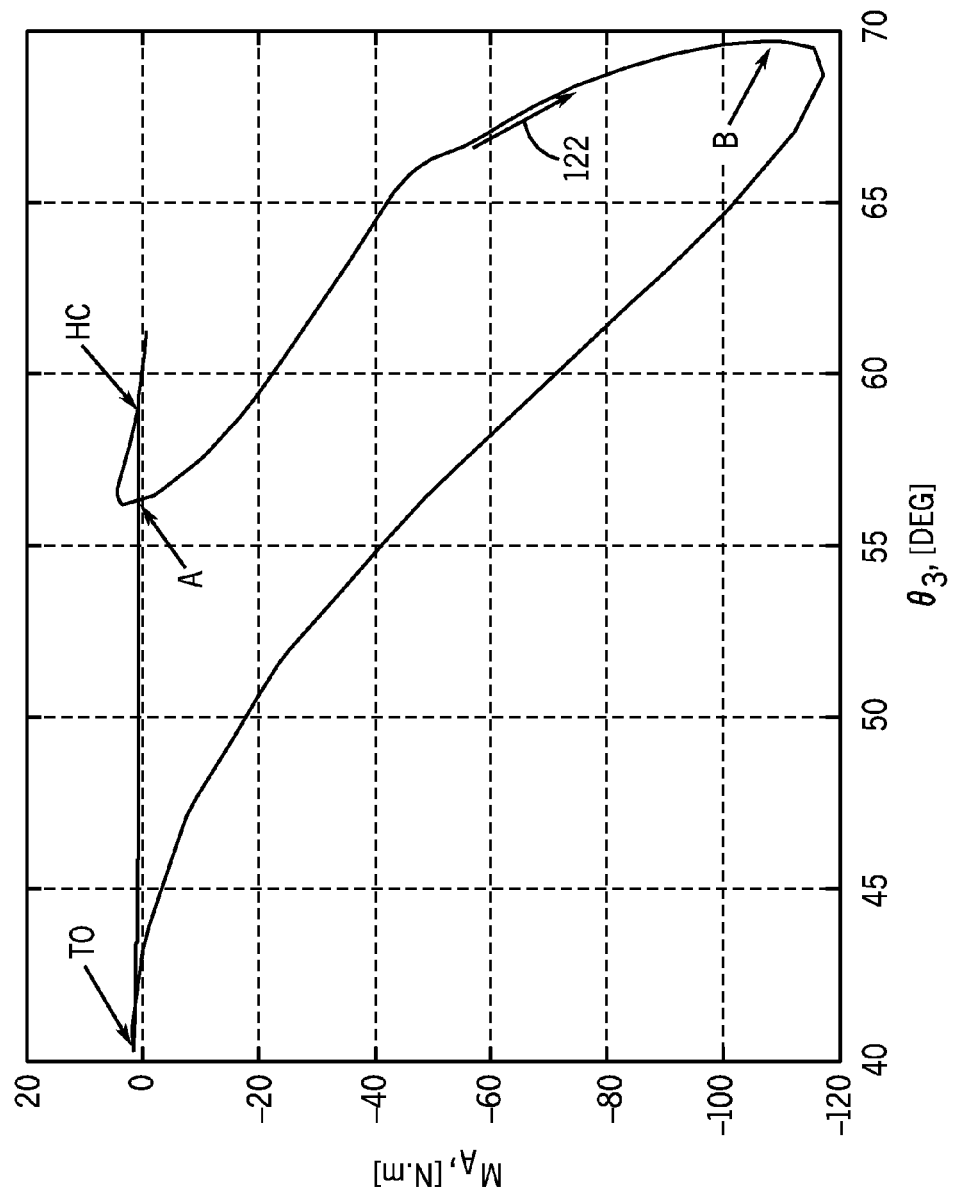
FIGS. 7 and 8 illustrate a plot of the ankle joint angle $\theta_3$ versus the moment about the ankle joint $M_A$.

From the joint angle $\theta_3$ (121) and the moment $M_A$ about the ankle joint during one stride, FIGS. 5 and 6, the moment $M_A$ can be plotted against the ankle joint angle $\theta_3$ (121), as shown in FIG. 7. The points A and B (where the mechanical power $P_A$ is zero), the toe off TO and heal contact HC are marked. If the curve is traversed from the point of heel contact to point A, we find that point A occurs when the moment $M_A$ is zero, thereby making the mechanical power $P_A$ zero. Continuing downward and in the direction of Arrow 122 we reach the point B. We find that point B is located at an extreme angular position, corresponding to a zero value of angular velocity, thereby again making the mechanical power $P_A$ zero. In the region between the points A and B the mechanical power is negative, i.e., the muscles acting on the ankle joint are absorbing energy of the leg system, thereby tending to reduce the total kinetic and potential energy of the leg. On the other hand, in the region between B and toe off TO, the mechanical power is positive, i.e., the muscles acting on the ankle joint are adding energy to the leg system, thereby tending to reduce the total kinetic and potential energy of the leg.

It can also be observed from FIG. 7 that the area between the curve from the point A to B along the arrow 122 and the zero moment ($M_A$) line is the work that the leg muscles have to do to absorb the kinetic and potential energy of the leg during the corresponding portion of the stride. On the other hand, the area under the curve from the point B to near the TO and the zero moment ($M_A$) line is the work that the leg muscles have to do to add kinetic and/or potential energy to the leg system during the corresponding portion of the stride. Therefore, the amount of energy that is to be absorbed by the leg muscles is smaller than the amount of the energy to be provided by the leg muscles. Neglecting the energy lost to friction, aerodynamic drag, etc., and also assuming that the trunk is moving at a constant speed, then the extra input energy is mostly to increase the kinetic and/or potential energy of the other segments of the lower limb and/or absorb the same. In actual walking, some energy is actually lost, and a certain amount of energy is transferred to the trunk to allow for its translational and rotational "oscillations", which similar to the leg, require input and output (energy absorption) from the body muscles.

Figure 8:
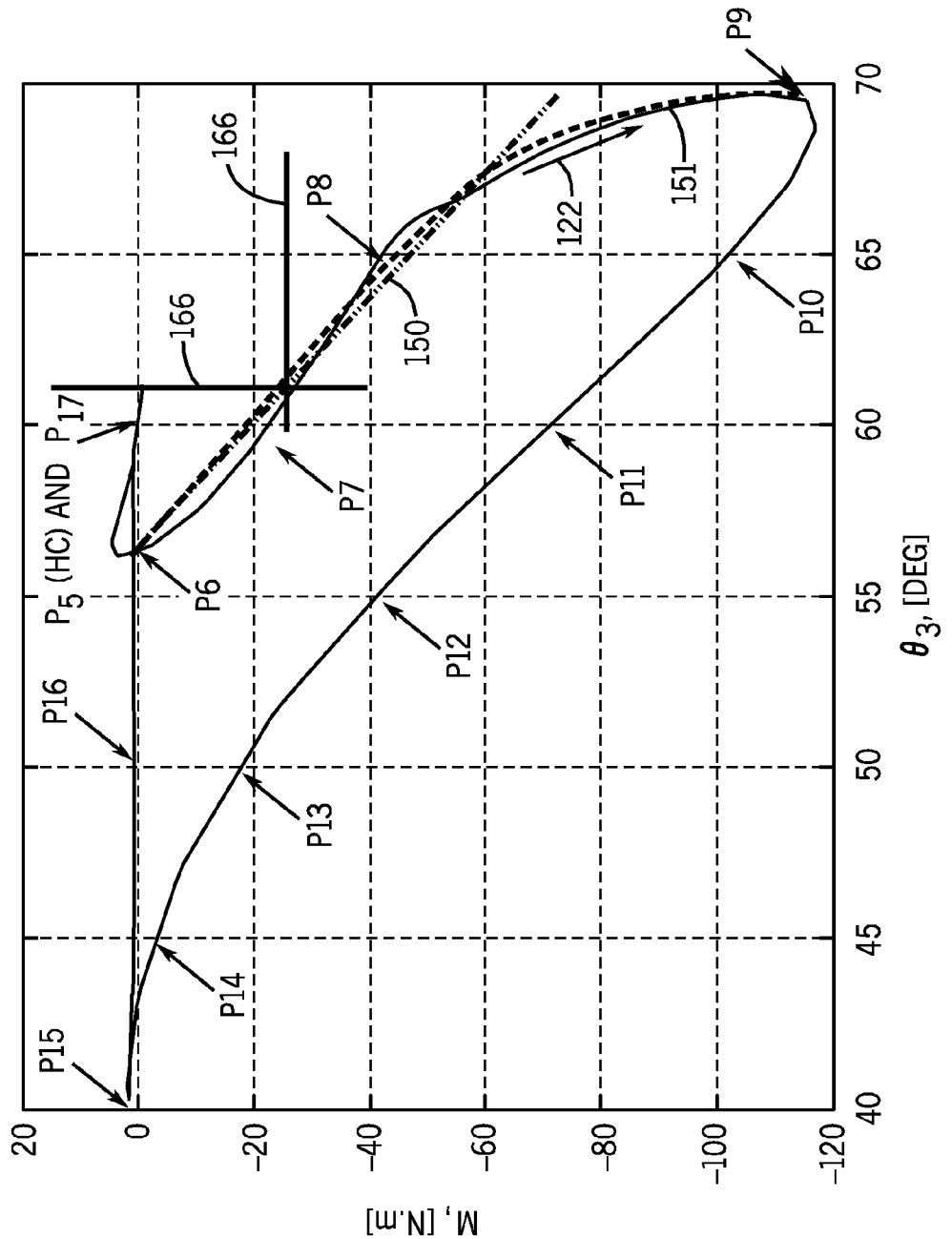

The ankle joint angle $\theta_3$ (121) versus the moment about the ankle joint $M_A$ is shown again in FIG. 8. In FIG. 8, the point P5 corresponds to the moment of heel contact (HC in FIGS. 4-6), following which the ankle joint angle $\theta_3$ versus ankle joint moment $M_A$ goes through the points P6 through P17. The area under the above curve from the point P6 to the point P9 and the zero moment ($M_A$) line is the aforementioned work (hereinafter referred to as $W_{ab}$) that the leg muscles have to do to absorb the kinetic and potential energy of the leg during the corresponding portion of the stride. The area under the above curve from the point P9 to the point P15 and the zero moment ($M_A$) line is the aforementioned work (hereinafter referred to as $W_{add}$) that the leg muscles have to do to add kinetic and/or potential energy to the leg system during the corresponding portion of the stride.

As can be clearly observed in FIG. 8, the work $W_{add}$ is significantly greater than the work $W_{ab}$. This means that for the case of the ankle, a passive (no input energy device such as a motor) walk-assist device that is to store the absorbed work $W_{ab}$ and pass it back to the leg through the ankle joint to reduce the work $W_{add}$ by the same amount (here, we are assuming an ideal system for the sake of describing the present method and related devices) is limited to a total energy exchange level of $W_{ab}$. Such a device can have a spring element with a (non-linear) spring rate $k_M$, given by $$M_A = k_M \theta_3 \qquad (3)$$

The ideal spring rate would yield an ankle joint moment $M_A$ versus ankle joint angle $\theta_3$ that traces the curve from the point P6 to the point P9 and back as the ankle joint $\theta_3$ is varied in the corresponding range of ankle joint angles shown in FIG. 8.

Figure 9:
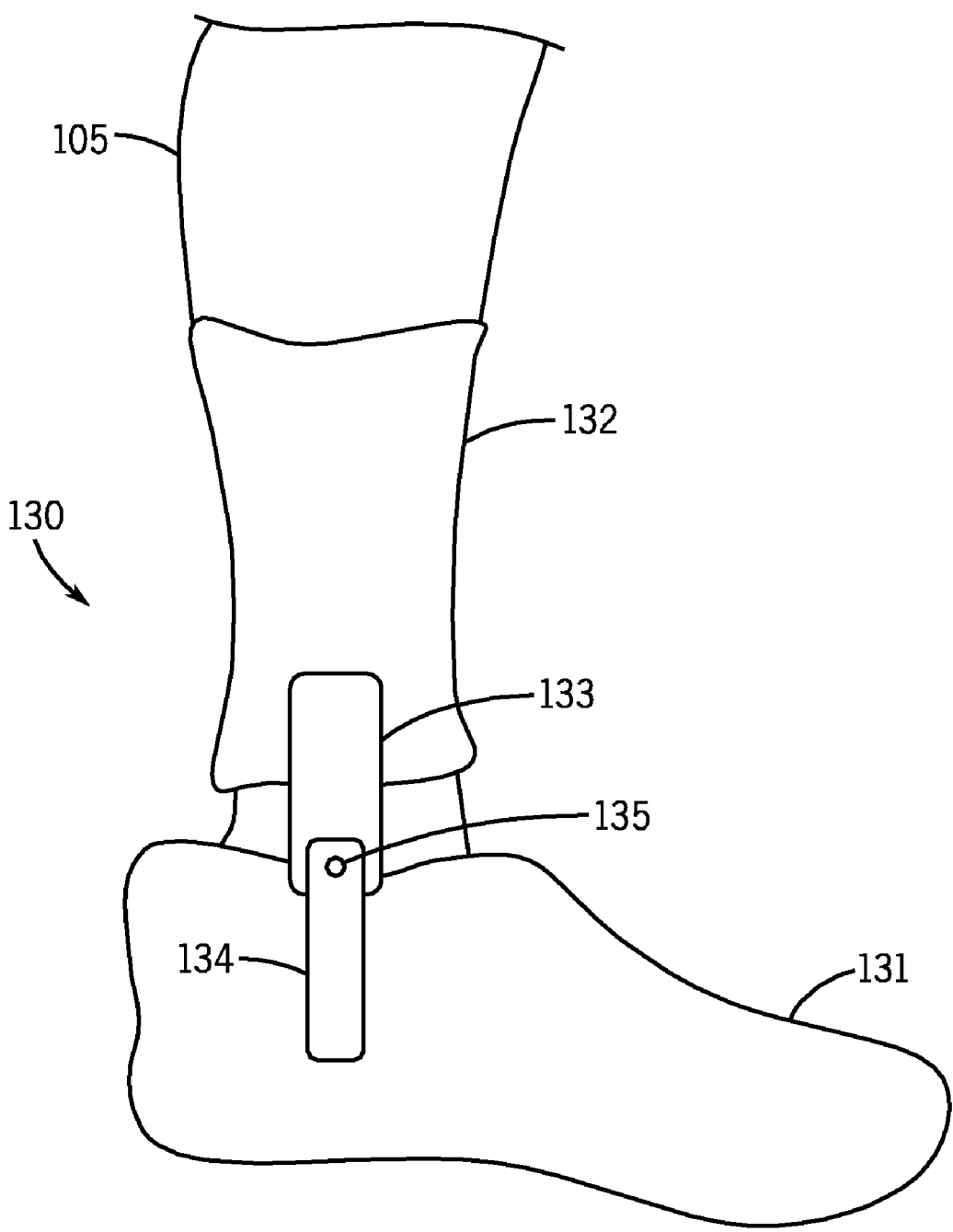
FIG. 9 illustrates a schematic of an embodiment of a walk-assist device for use on an ankle.

A schematic of one embodiment is shown in FIG. 9. The walk-assist device 130 comprises two parts, one of which is a cuff 132 that is worn, preferably relatively tightly, on the leg 105. A second part 131 is worn on the foot, also preferably relatively tightly, and covers part or preferably the entire foot as a shoe or a boot.

The two parts 131 and the 132 are hinged at the ankle joint by the hinge 135, which may be provided through intermediate elements 133 and 134, which are fixed to the leg part 132 and foot part 131, respectively, by any means known in the art. A torsional (linear, etc.) spring 136 (not shown in this schematic for clarity, shown in FIG. 10) is provided at the joint 135 and provides the aforementioned non-linear ankle joint moment $M_A$ versus ankle joint angle $\theta_3$ curve characteristic.

As can be seen in FIG. 8, the walk assist device 130 generates the aforementioned ankle joint moment $M_A$ versus ankle joint angle $\theta_3$ from the point P6 to P9, and zero ankle joint moment $M_A$ in the remainder range of ankle joint angle $\theta_3$, i.e., from the point P9 to P15. Here, the small zero moment range from the point P5 (P17) to the point P6 is neglected, but such multi-tracked ranges of joint motion are addressed below. The aforementioned zero ankle joint moment $M_A$ in one part and nonzero moment $M_A$ in another part of the range of ankle joint angle $\theta_3$ (without multi-tracked ranges) can be achieved using a variety of methods, including the following (in the following schematics, only the hinge joint 135 and its intermediate elements, i.e., the relatively rigid elements 133 and 134 and in certain cases the leg and foot worn parts 132 and 131 are shown).

Figure 10:
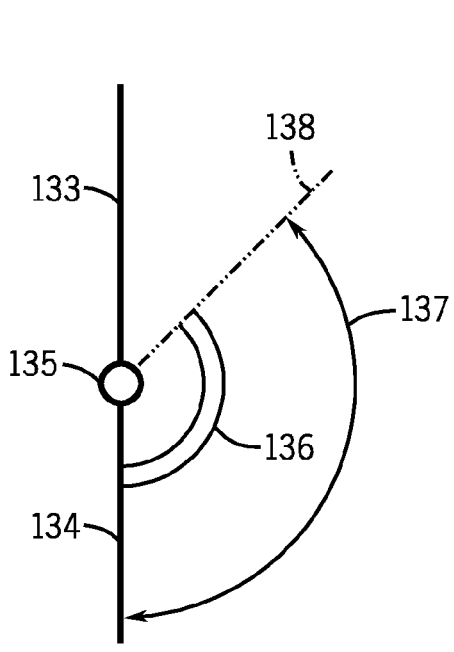
FIGS. 10, 11 and 12 illustrate schematics of the embodiment of FIG. 9 with a torsional spring, a linear spring and an elastic element, respectively.
Figure 11:
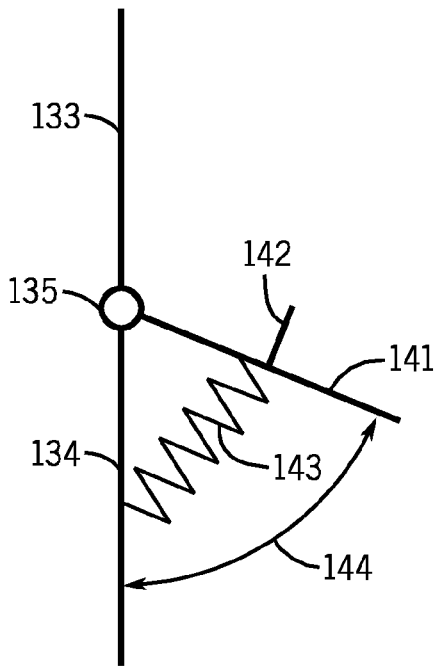

During the ankle rotation, the spring element 136 (either torsional, linear, etc.) engages the connecting parts 133 and 134 in the range that moment is to be generated and disengages in the remaining (zero moment) range of ankle motion. The schematic of this embodiment with torsional and linear springs are shown in FIGS. 10 and 11, respectively. Other types of springs may be employed in a similar manner. In FIG. 10, the link 133 is free to rotate relative to link 134 about the rotary joint 135 without generating resistance to rotation by the torsional spring 136 (a torsional springs can make a significantly larger arc, and may even make several turns, however, a short arc is shown in FIG. 10 for clarity), unless it enters the range 137 (starting from the position 138 to the link 134). A similar embodiment is shown in FIG. 11, in which a compressive linear spring 143 is used to connect the link 134 to a third link 141. The link 133 is free to rotate until it reaches an extension 142 of link 141, at which time, the spring 143 begins to provide resistance to further rotation of the link 133 within the range 144. In the embodiments of FIGS. 10 and 11, the link 133 is considered to be prevented by the link 134 to rotate counter clockwise past the link 134. It is appreciated by those skilled in the art that other types of springs (e.g., tensile helical springs, or those working in bending and even the structural flexibility of the two links 133 and 134) and other joints, such as living rotary joints, and linkage configurations could be used to perform the aforementioned tasks.

Figure 12:
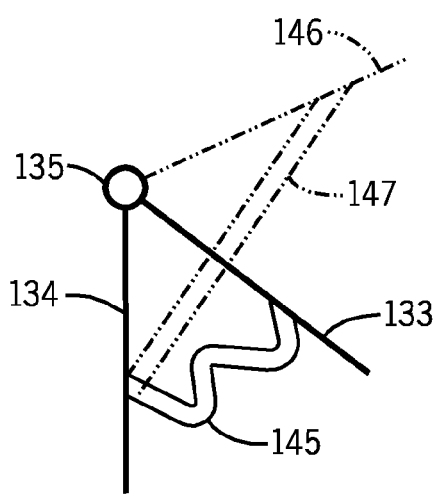

An elastic element 145 such as a natural or synthetic elastomer can also be attached to the links 133 and 134 as shown in FIG. 12. The link 133 is free to rotate relative to the link 134 from close to the link 134 in the counter clockwise direction until it reaches the position 146, at which time the elastic element 145 becomes taut (position 147), and begins to deform elastically with further counter clockwise rotation of the link 133 relative to the link 134, thereby generating a restoring moment. The links 133 and 134 and the elastic element 145 can be integral, and are attached directly to the foot and leg worn components 132 and 131, respectively. In one embodiment, the links 133 and 134, the elastic element 145 and the leg and foot components 132 and 131 are integral and in the form of a shoe with leg brace or preferably as a boot.

In the above embodiments, the spring rate may be constant or a non-linear function of displacement (FIGS. 11 and 12) or angular rotation (FIG. 10). If the torsional spring 136, FIG. 10, has a constant rate, then the corresponding ankle joint moment $M_A$ versus ankle joint angle $\theta_3$ becomes linear and similar to the line 150 shown in FIG. 8. The slope of the line 150 indicates the spring rate and for the one shown in FIG. 8 it is chosen to cover the entire aforementioned range of rotation, i.e., the range corresponding to the range of points P6 to P9 with minimal amount of moment above the indicated curve. The spring rate is also selected such that the moment-rotation line 150 covers as much of the area under the curve between the points P6 and P9, i.e., to store as much energy as possible when using a linear spring. In addition, the moment-rotation line begins from zero moment, indicating that the torsional spring 136 is not preloaded, which in certain cases can increase the total amount of energy that could be stored in the spring element.

If the spring element 143 in the joint mechanism shown in FIG. 11 has a near constant spring rate and if the range of rotation 144 is relatively small (such as about 12 deg. as seen in FIG. 8 for the ankle joint), then the resulting ankle joint moment $M_A$ versus ankle joint angle $\theta_3$ relationship becomes nearly linear. For larger ranges of angular rotation, the above relationship becomes a function of the angle 144 (FIG. 11).

In the three embodiments shown in FIGS. 10-12, the spring rate may be selected not to be constant. An advantage of using non-linear springs is that the spring force (moment) versus displacement (rotation) characteristics may be selected such that the resulting ankle joint moment $M_A$ versus ankle joint angle $\theta_3$ curves become close to the curve from the point P6 to P9, FIG. 8. As an example, the curve 151 shown in FIG. 8 results in the storage of most of the energy available during the ankle rotation from P6 to P9 and can be readily produced by an elastomeric element used in the embodiment of FIG. 12. In addition, by using springs with appropriate non-linear force (moment) versus displacement (rotation) characteristics, the embodiments of FIGS. 11 and 10 may produce ankle joint moment $M_A$ versus ankle joint angle $\theta_3$ curves that are very close to that of curve 151 in FIG. 8.

Furthermore, instead of using non-linear spring (elastic) elements, one may use linkage mechanisms (preferably made with living joints) or cams to achieve the desired force (moment) versus displacement (rotation) characteristics. The corresponding devices may, however, become more complex and are not the preferred choice whenever simple spring or elastic elements could suffice, even though more complex force (moment) versus displacement (rotation) characteristics could be obtained using cams and more complex mechanisms.

In the embodiment shown in FIG. 9, the ankle joint is shown as essentially fixed relative to the foot and the leg. However, the actual instantaneous axis of rotation of the ankle (and the knee) joints is neither fixed nor always perpendicular to the plane of locomotion. As a result, it is highly preferable to provide embodiments in which the instantaneous axis of rotation is allowed to float and tilt in order to follow the actual unconstrained axis of rotation as closely as possible. In practice, since the axes of joint rotations undergo relatively small displacements and tilting angles, therefore, they require minimal range of displacement and tilting freedom. The axes of joint rotations is discussed in e.g., Rastegar, J., Miller, N., and Barmada, R., "An Apparatus for Measuring the Load-Displacement and Load-Dependent Kinematic Characteristics of Articulating Joints. Application to the Human Ankle Joint," *ASME Journal of Biomechanical Engineering* 102, pp. 208-213 (1980); Rastegar, J., Piziali, R., L., Nagel, D. A., and Schurman, D. J., "Effect of Fixed Axis of Rotation on the Varus-Valgus and Torsional Load-Displacement Characteristics of the In-Vitro Human Knee," *ASME Journal of Biomechanical Engineering* 101 (1979); Piziali, R. L., Rastegar, J., and Nagel, D. A., "The Contribution of the Cruciate Ligaments to the Load-Displacement Characteristics of the Human Knee," *ASME Journal of Biomechanical Engineering* 102, pp. 277-283 (1980); Piziali, R. L., Rastegar, J., and Nagel, D. A., "Measurement of the Non-Linear, Coupled Stiffness Characteristics of the Human Knee," *Journal of Biomechanics* 10, (1977); Rastegar, J., Miller, N., and Barmada, R., "Relative Motion of the Tibia With Respect to the Foot During Internal-External Rotation of a Human Ankle Joint," *ASME Paper No.* 79-Bio-4; Rastegar, J., Miller, N., and Barmada, R., "Measurement of the Internal-External Load-Displacement Characteristics of the In-Vitro Human Ankle Joint," *ASME Paper No.* 79-Bio-3; Miller, N., Rastegar, J., and Barmada, R., "Torsional Characteristics of the Human Knee and its Passive Elements Under Simulated Anatomical Conditions," *ASME Advances In Bioengineering*, pp. 91-93 (1979); Rastegar, J., Miller, N., and Barmada, R., "Relative Motion of the Tibia With Respect to the Foot During Internal-External Rotation of a Human Ankle Joint," *ASME Summer Conference* (1979); Miller, N., Rastegar, J., and Barmada, R., "Internal-External Load-Displacement Characteristics of the In-Vitro Human Ankle Joint," *ASME Summer Conference* (1979); Piziali, R. L., Rastegar, J., and Nagel, D. A., "The Axis of Varus-Valgus Rotation of the In-Vitro Human Knee Joint," *Proceedings of 24$^{th}$ Orthopaedic Research Society* (1978); Rastegar, J., Piziali, R. L., and Nagel, D. A., "Varus-Valgus Stiffness of the In-Vitro Human Knee Joint," *Proceedings of 23rd Orthopaedic Research Society* (1977); Rastegar, J., Piziali, R. L., and Nagel, D. A., "Torsional Load-Displacement Characteristics of the In-Vitro Human Knee," *Proceedings of 30$^{th}$ ACEMB* (1977); Piziali, R. L., Rastegar, J., Nagel, D. A., and Hight, T., "Knee Mechanics and Analytical Modeling in Lower Limb Injuries," *Proceedings of 2$^{nd}$ International Conference on Ski Trauma and Ski Safety*, Spain (1977); Rastegar, J., Piziali, R. L., and Nagel, D. A., "Varus-Valgus Stiffness of the In-Vitro Human Knee," *ASME Winter Annual Meeting* (1976); and Rastegar, J., Piziali, R. L., Seering, W. P., and Nagel, D. A., "The Function of the Passive Knee Structures in Anterior-Posterior Tibial Displacement," *Proceedings of 28$^{th}$ ACEMB* (1975).

Figure 13:
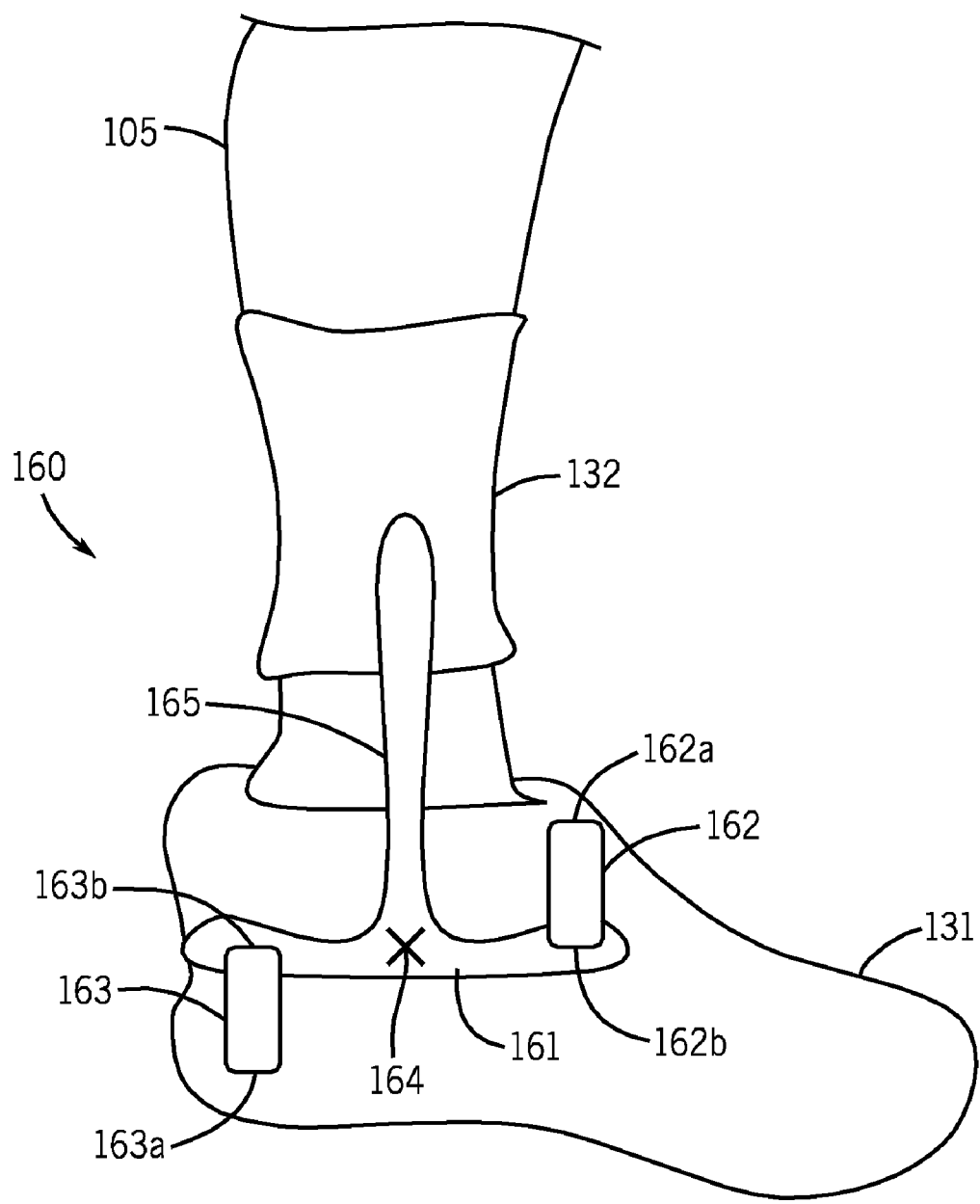
FIG. 13 illustrates a schematic of another embodiment of a walk-assist device for use on an ankle.

In the embodiment of FIG. 13, the walk-assist device 160 for the ankle joint consists of the aforementioned leg cuff 132 and foot worn part 131 (preferably shoe or boot, hereinafter referred to as shoe 131) elements. A relatively flat element 161 is fixed to the leg cuff 132. The element 161 is relatively thin but rigid in bending in its own plane, i.e., in the plane of the illustration, but is relatively flexible in bending out of the plane of the illustration. Two elastic elements 162 and 163 are fixed to the shoe 131 on one side (162a, 163a) and fixed to the element 161 on the other side (162b, 163b) as shown in FIG. 13. Thus, as the leg 105 rotates clockwise relative to the foot, the two elastic elements 162 and 163 are stretched, thereby generating a couple (moment) about a center of rotation 164. One advantage of this embodiment is that the two elastic elements 162 and 163 provide a moment about the center of rotation 164 and generate minimal joint forces. This embodiment may be modified by not fixing the element 161 to the leg cuff 132, but constraining it loosely within a pocket (not shown) so that it is free to displace laterally within a certain range of leg rotation relative to the foot and force relative rotation of the element 161 relative to the foot in another range of such rotation to obtain ankle joint moment $M_A$ versus ankle joint angle $\theta_3$ curves close to the curve from point P6 to P9 shown in FIG. 8. This modification has also an advantage of allowing the instantaneous center of rotation 164 (together with the element 161) to displace laterally to near the actual instantaneous center of rotation since the elastic elements 162 and 163 have minimal resistance to lateral bending. Similarly, since the element 161 and the elastic elements 162 and 163 have minimal resistance to bending and torsion in and out of the plane of illustration, the instantaneous axis of rotation (normally perpendicular to the plane of illustration) can be tilted up and down and/or to the right and left a small amount to closely follow the actual instantaneous axis of ankle rotation. In addition, since the center of rotation 164 is located central to the elastic elements 162 and 163, the center of rotation 164 may be floated up along the stem 165 of the element 161 or below the stem 165 while minimally affecting the nearly pure couple nature of the forces generated in the elastic elements 162 and 163.

In general, other coupling elements that allow relatively free displacement of the axis of rotation of the ankle joint and its slight tilting could be used together with preferably couple producing elastic elements or torsional springs to provide the aforementioned joint moment versus angular rotation. Such couplings are well known in the art and are used regularly to couple shafts such that they can tolerate relatively small offsets and angular misalignment. Such couplings are, however, generally bulky and occupy a considerable space, which is not desirable for the present applications. Therefore embodiments such as the one shown in FIG. 13 are more appropriate and could be made as a compact device that could readily be integrated into boots or as a lightweight bracing. The best mechanism design for the aforementioned purpose is one that operates such that the loads applied to the passive ankle joint elements such as ligaments and the joint surface contacts are minimally altered or reduced and not increased.

It should be noted that in the schematics of FIGS. 9 and 13, only one lateral joint mechanism for energy storage and release is shown. In general, however, the preferred embodiments use one such mechanism on both sides of the ankle (and the knee) joint to provide a more uniform and symmetric moment across the joint.

In the above embodiments, the portion of the ankle joint moment $M_A$ versus ankle joint angle $\theta_3$ curve from point P6 to point P5 (P17) was neglected and the aforementioned embodiments would produce the curves 150 or 155 without the segment corresponding to the segment P6 to P5 (P17). If it is desired to keep the segment P6 to P5 (P17) with same passive mechanisms, then the mechanisms shown in FIGS. 9-13 and the others described above must only produce the portion of the ankle joint moment $M_A$ versus ankle joint angle $\theta_3$ curve positioned to the right of the vertical line 166, FIG. 8, to the point P9. For example, the spring (elastic) elements that produce the 150 and 151 curves can still be used, but for the aforementioned range, i.e., from the vertical line 166 to the point P9. The corresponding spring (elastic) elements must, however, be preloaded to the line 167, FIG. 8, using a number of methods known in the art, e.g., by providing a stop to prevent a preloaded spring or elastic element from moving back to its no-load configuration.

From FIG. 8, the amount of energy to that the muscles have to spend to absorb the leg kinetic and or potential energy, i.e., approximately the area under the curve to the zero moment line from the point P6 to P9 may be estimated by simply counting the number of grid squares, in this case about 5.1 squares. From the units in FIG. 8, it is readily seen that each square corresponds to 20 N-m times 5 degrees or about 1.75 N-m or Joules of energy. The energy that the muscles have to spend to add kinetic and or potential energy to the leg system, i.e., approximately the area under the curve to the zero moment line from the point P9 to P15 may be similarly estimated to be 15 squares. Thus, the total energy that the muscles have to provide about the ankle joint is about 20.1 squares, i.e., 20.1×1.75=35.175 J. With the aforementioned embodiments using an elastic element with the spring rate 151, FIG. 8, 5.1 squares, i.e., 5.1×1.75=8.925 J of energy is stored in the elastic element while walk-assist device is absorbing kinetic and/or potential energy from the leg system (from the point P5 to P9, FIG. 8) and would provide it back to the leg system during the portion of the stride that kinetic and/or potential energy has to be increased (from the point P9 to P15, FIG. 8). Thus, up to 2×8.935=17.85 J out of the above 35.175 J, or up to 50.7 percent of energy spent by the muscles forces at the ankle joints could be saved by using the disclosed walk-assist devices. In practice, however, due to friction losses and other inefficiencies, the actual energy savings should be expected to be lower, but as can be seen, is significant nonetheless.

In addition, as shown below, the total savings in the energy spent by the muscles acting at the ankle joints can be significantly increased by providing a walk-assist device that operates as a total leg system on all the joints of the lower extremity. For the case of the ankle joint, such a device would store energy that has to be absorbed by the muscles acting at the other joints of the leg and transfer the energy to the ankle joints during the ankle joint rotation from the point P9 to P15, FIG. 8.

With passive elastic (spring) elements, whether with linear or non-linear load (force, moment, torque, etc.) versus displacement (linear displacement, bending displacement, rotation, etc.) characteristics, hereinafter referred to as simply the load-displacement characteristics, it is impossible to obtain complex rate characteristics that are required to follow the type characteristics shown for the ankle joint in FIG. 8. As can be seen in FIG. 8, during the stride, the ankle joint moment versus ankle joint rotation curve starts from the point P5; becomes slightly positive as the angle is reduced, then comes back to zero at the point P6; then reverses its slope providing increasing levels of moment (negative in sign) with increasing angle $\theta_3$ up to around the point P9; then as the ankle joint angle decreased, it follows the branch from the point P9 through P10-P14, ending up at the point P15, this time at higher (more negative) moment levels for corresponding angles (within the range of P5 to P9); the ankle joint is then returned to the starting point P5 (indicated also as P17 in FIG. 8), at near zero moment levels following the line from the point P15 through P16 to the point P17.

Another characteristic of the load-displacement characteristics of the type shown for the ankle joint in FIG. 8 (similar types of load-displacement characteristics during gate are found at the knee and the hip joints) is that the total amount of the energy that is absorbed by the muscles (effectively the area under the curve from the point P6 to the point P9 and the zero moment line) is not the same as the amount of the energy that the muscles have to provide to increase the kinetic and/or potential energy of the system (effectively the area under the curve from the point P9 to the point P15 and the zero moment line). In this case, more energy is provided by the muscles through the ankle joint then is absorbed. As a result, to provide part or all the extra needed energy from the energy stored from walk-assist device components mounted on the other joints of the body such as the knee and the hip joints, the ankle joint device must be coupled (preferably) mechanically to the devices at those joints. Such coupling is possible but is very difficult to accomplish without the use of any active elements. Here, by active elements it is meant powered elements, such as those that are powered electrically, pneumatically or by fluid power and without regards to the source of power, whether internally or externally generated. The use of purely passive elements for this task is made more difficult considering the fact that the subject wearing the walk-assist device may use various gate patterns, therefore requiring the parameters of the walk-assist device to be capable of adapting to varying gate patterns.

It must, however, be noted that with pure passive elements, as it was shown above for the case of the ankle joint, walk-assist devices can still significantly reduce the amount of energy that the muscles have to provide during locomotion. However, to increase their efficiency even more and to expand the application of such devices to several other fields as described below, some or all the aforementioned shortcomings of purely passive constructions can be overcome. In the following, a number of embodiments that use very simple and low power active elements are disclosed that can be used to construct walk-assist devices without the aforementioned shortcomings.

The basic active element of the aforementioned embodiments is a braking (or locking) element. Such braking elements are used to stop linear or rotary motions of relatively rigid parts, and for this reason may be more appropriate to call them locking elements. Such braking elements may in certain case also act as a clutch. In the present disclosure these elements are generally referred to as braking elements. The main purpose of using such brake elements is to at times "lock" an extended (compressed) spring in place, thereby preventing it from applying a pulling (pushing) force (similarly for torsional or other types of springs) to the components that the spring is attached to; or at times lock two or more relatively rigid parts together, thereby preventing their relative motion; or at times unlock the aforementioned extended (compressed) spring, allowing it to exert pulling (pushing) force to the components that the spring is attached to; or at times unlock and allow the relative motion of aforementioned two or more relatively rigid parts. The aforementioned relative motions may be translational or rotational or may be a combination of the two.

In FIG. 14, two relatively rigid links 170 and 171 are shown attached by a rotary joint 172. The two links are free to rotate relative to each other, thereby varying the angle 173. By positioning a braking element (not shown) at the joint 172, the links 170 and 171 can be locked together, thereby forming a relatively rigid structure at any desired angle 173.

In the schematic of FIG. 15, the two links 170 and 171 shown in FIG. 14 are shown with an added elastic (spring) element 174. The aforementioned braking element (not shown) is still considered to be present at or about the joint 172. At any point in time and while the elastic element 174 is in tension or compression, if the braking element locks the joint 172, i.e., prevents the relative motion between the two links 170 and 171, then the two links 170 and 171 would form a structure and the potential energy stored in the elastic element 174 becomes an internal energy to the resulting structure, and potential energy could no longer be transferred to the spring element through the links or from the spring element to the links.

It is appreciated by those skilled in the art that even though in the embodiment of FIG. 15 a helical spring 174 is shown with the rotary joint 172, similar braking elements may be used to lock and later release relative motion between two or more elements joined with other types of joints and with more than one degree-of-freedom (which is the case for the rotary joint 172), and lock in and later release potential energy stored in any type of elastic element, even those provided by the flexibility of the structure of the related devices. For example, a sliding, planar, cylindrical or spherical joint may have been used instead of the rotary joint 172; or torsional, bending type or elastomeric elements may have been used in place of the helical spring 174.

The braking aforementioned element may be of any type known in the art, such as a magnetic or brake shoe type operated electrically, pneumatically or hydraulically that locks either the two links together or directly locks the joint 172. Such braking devices usually rely on friction-generated force (moment or torque) to provide the aforementioned braking (locking) force (moment or torque). A typical such braking element is shown in the schematics of FIGS. 16 and 17. A sliding joint that allows their relative displacement in the direction 186 connects the two relatively rigid components 180 and 181 as shown in FIG. 16. A cross-section of the sliding joint is shown in FIG. 17. The inner component 181 is seen to be free to move relative to the outer component 180 in the axial direction, i.e., in the direction indicated by Arrow 186 (the clearance between the two components is exaggerated for the sake of clarity). The inner component 181 is provided with a recess with sides 187 to allow for the mounting of at least one braking element. The braking element consists of at least one braking pad 183 and a displacement actuator 184, which imparts back and forth motion to the braking pad 183. The actuation device may be electrically operated such as like a solenoid, or may be pneumatically or hydraulically operated, or operated by a piezoelectric actuation device, or any other type of actuation device known in the art. To lock the sliding joint, the actuator 184 is activated and used to press the braking pad 183 against the surface 185 of the inner component 181. As a result, the sliding motion of the inner component 181 relative to the outer component 180 is no longer possible. The amount of force applied by the actuator 184 and the friction coefficient between the braking pad 183 and the surface 185 of the inner component 181 determines how much axial force in the direction 186 this braking element(s) can resist before slippage. Such braking elements can therefore provide a limit on the amount of force (moment or torque) that the joint must resist before allowing slippage. This characteristic of these embodiments may be used, for example, to limit the amount of potential energy to be stored in elastic elements or the maximum force (moment or torque) that a locked joint should resist.

The aforementioned braking elements may be normally open, i.e., apply no braking force without an input actuator force (moment or torque), or may be normally closed, i.e., the applied force (moment or torque) is used to disengage the braking element. In general, either type of braking element may be used in the walk-assist devices. However, it is preferable that appropriate types be used so that in the case of loss of actuation power, the walk-assist device does not hinder walking (running) in any way or provide a destabilizing joint force, or increase the probability of injury or become unsafe.

Other embodiments of braking elements that are particularly suitable for the disclosed walk-assist devices are described below.

Using an appropriate number of the aforementioned braking elements and elastic elements with linear and/or non-linear spring rates and together with relatively rigid links and joints, assemblies with load-displacement characteristics that approximate that of almost any of the lower extremity joints, such as that of the ankle joint shown in FIG. 7, may be obtained. The braking elements, elastic elements and links may be configured in parallel and/or in series. Here, the load is intended to also mean moment or torque, and displacement is intended to also mean angular displacement.

Figure 18:
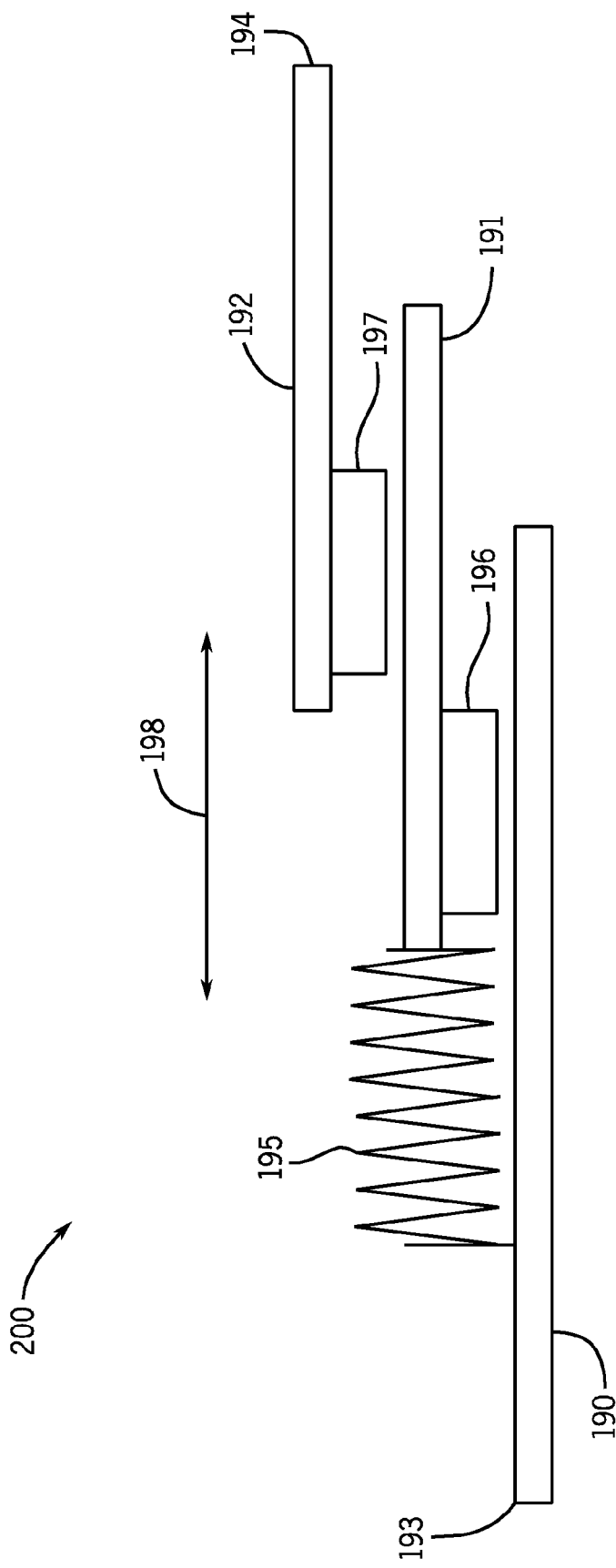
FIG. 18 illustrates a schematic of a simple linkage mechanism.

As an example, consider the schematic of the simple linkage mechanism 200 shown in FIG. 18. The mechanism consists of relatively rigid links 190, 191 and 193. The links 191 and 192 and the links 192 and 193 are connected by sliding joints (not shown) that allow each pair of links to undergo a sliding motion in the direction of Arrow 198. The link 190 at its end 193 and the link 192 at its end 194 are attached to two objects that can undergo relative motion. For example, the mechanism 200 may replace the spring element 174 in FIG. 15 (in this application, the mechanism 200 has to be attached to the links 170 and 171 by rotary joints) to provide a combination of free rotation, rigid constraint or spring element between the links 170 and 171. The mechanism 200 provides such flexibility as follows.

Braking elements 196 and 197 similar to those described above are provided between the links 190 and 191 and the links 191 and 192, respectively. When activated, the brake element 196 (197) locks the two links 190 and 191 (191 and 192) together, thereby preventing their relative displacement. In this configuration, the links 190 and 191 (191 and 192) form a relatively rigid structure. When the brake element 196 (197) is deactivated, the links 190 and 191 (191 and 192) are free to undergo relative sliding motion in direction 198. For the case of the pair of links 190 and 191, the two links are connected by the spring element 195, which when the braking element is deactivated, would provide a force resisting the relative displacement of the two links, and could be used to store potential energy or to extract the stored potential energy at the desired range of motion, and in other ranges of motion to either make the mechanism 200 act as a structure or allow free motion between the connected objects in the direction of mechanism 200 displacement. It is noted that in the mechanism 200, once the spring element 195 is deformed (in tension or in compression), a corresponding amount of potential energy is stored in the elastic element. All or part of this potential energy may, however, be released by disengaging the brake elements 196 and 197, and thereby allowing the link 191 to displace, in which case an energy dissipative element such as a friction pad or a viscous or viscoelastic damping element is preferably used to attach either or both of the link pairs 190 and 191 and/or 191 and 192 in order to minimize vibration of the released link 191.

In a modification of this embodiment, a second spring element (not shown), preferably with a spring rate different from that of spring element 195, is used to attach the links 191 and 192. As a result, by sequentially locking each spring element, the mechanism 200 is used to provide an effective spring with three possible spring rates The first spring rate (the spring rate of the spring element 195) is obtained by the activation of the brake element 197 and deactivation of the braking element 196. The second spring rate (the spring rate of the aforementioned spring attached to the links 191 and 192) is obtained by the activation of the brake element 196 and deactivation of the brake element 197. The third spring rate (the spring rate being equal to the inverse of the sum of the inverses of the above two spring rates) is obtained by the deactivation of both of the brake elements 196 and 197.

For the sake of simplicity, the links 190 and 191 and the spring 195 and brake element 196 of the mechanism 200, FIG. 18 and also redrawn in FIG. 19*a*, are shown in the simple diagram of FIG. 19*b* and marked as the assembly 210. Similarly, the links 191 and 192 and the brake element 197 are shown as the schematic of FIG. 19*c* and marked as the assembly 211. Two or more elements 210 and 211 may then be connected in series, in parallel or their combination to obtain almost any desired force (moment or torque) versus displacement (rotation) characteristics, such as the one shown in FIG. 7.

For example, consider the schematic of FIG. 20*a* showing three elements 210 (indicated as 210*a*, 210*b* and 210*c*) being connected in series to obtain the assembly 220. In FIG. 20*a*, the displacements $\Delta x_1$, $\Delta x_2$ and $\Delta x_3$ are associated with the elements 210*a*, 210*b* and 210*c*, respectively. Let all three springs elements 195*a*, 195*b*, 195*c* of the elements 210 have a spring rate k. If the three brake elements 196*a*, 196*b*, 196*c* are activated, then the assembly acts as a structure. However, if all the three brake elements are deactivated, the effective spring rate $K_e$ is then given by $$1/K_e = 3/k \text{ or } K_e = k/3 \quad (4)$$

Figure 21:
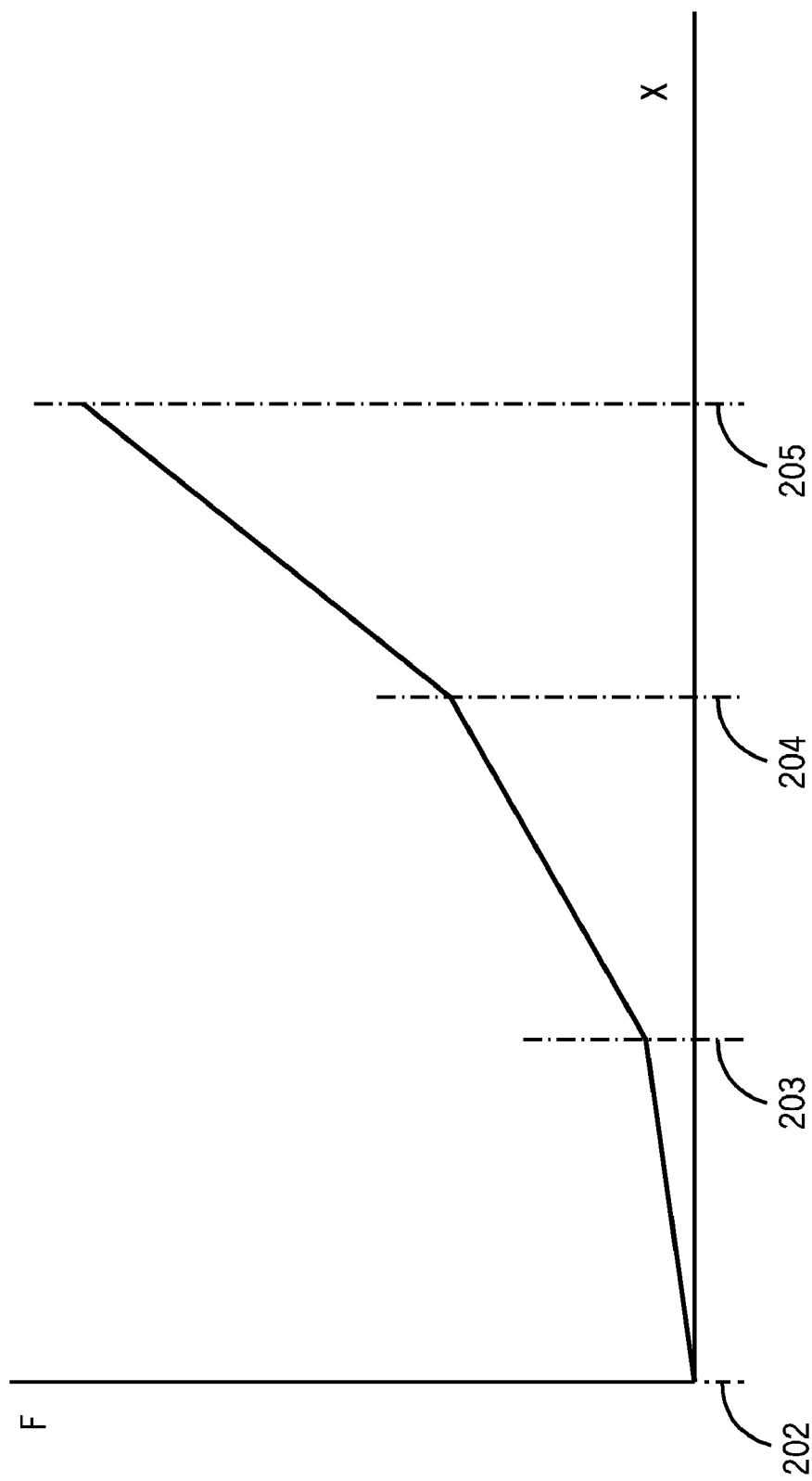

Now consider the situation in which the three springs elements 195a, 195b, 195c are at their undeformed lengths. One end of the assembly 220 is fixed to the ground 201 and the end 207 is pulled by applying a force F in the indicated direction. Initially, all the three brake elements 196a, 196b, 196c are considered to be deactivated, while the end 207 is displaced an amount X (from the point 202 to 203) as shown in the plot of FIG. 21. During this period, the equivalent spring rate has the lowest value as given above, i.e., $K_e = k/3$, and the force-displacement plot is linear (all three springs are considered to have constant spring rates k) as shown in the plot of FIG. 21. From the point 203 to the point 204, one of the three brake elements is activated, thereby increasing the equivalent spring rate to k/2. From the point 204 to 205, two of the brake elements are activated, thereby increasing the equivalent spring rate further to k. The force-displacement plots for the latter two ranges of motion are also shown in the plot of FIG. 21. As can be seen, the assembly of three elements 210 allows the user to approximate a curve of arbitrary shape. Obviously, by using more elements 210 and also adding elements, and utilizing both serial (FIG. 20a) and parallel (FIG. 20b) configurations, almost any force (moment or torque) versus displacement (rotation) curve could be achieved.

It will be appreciated by those skilled in the art that for proper sequence of brake element activation and deactivation, sensory devices can be employed to measure the relative displacement of the joint (the connected objects). In addition, since the walk-assist devices, for example the aforementioned one attached to the ankle joint, must undergo more than one back and forth motion during each cycle of stride (see FIG. 7), and as a result, at one ankle joint angle several instantaneous spring rates and instantaneous joint moments have to be present, therefore a control unit, preferably based on a programmable microprocessor, is needed to provide the proper sequence of brake element activation and deactivation (and potential energy release if required).

It is also noted that in most cases, at the end of each stride cycle, a balance of potential energy may be present in one or more of the spring elements of the walk-assist device. This was not the case for the aforementioned isolated walk-assist device used on a subject ankle since the amount of energy absorbed by the leg muscles acting on the ankle joint was shown to be smaller than the amount of energy that the leg muscles have to provide to increase the potential and/or kinetic energy of the leg. Since some of the joints are like the former and some like the latter, a whole leg or body mounted walk-assist device needs to link the joints, preferably by passive mechanisms or at most by mechanisms equipped with brake (clutch) elements, and utilize a control system (preferably operated by a programmable microprocessor) to sequentially activate and deactivate the brake (clutch) elements to tend to balance the aforementioned energy requirements at each joint.

In addition, a walk-assist device that is equipped with a microprocessor control can use sensory information from the joint angles (such as potentiometer or optical encoder type of sensors) to optimally time the aforementioned sequence of activation and deactivation of the brake and clutch elements as, for example, the subject changes the pace of walking, or is walking on an inclined (up or down) surface, etc. In another embodiment, at least one accelerometer (e.g., a MEMS based tri-axial type accelerometer) is also used (mounted on the subject body, such as on the waist together with the programmable control unit) to further tune the aforementioned operation of the walk-assist device. The operation of the walk-assist device can be improved further by providing at least one gyro (such as a MEMS type) to measure changes in the body angle and use it in the determination of the optimal timing of the activation and deactivation of the brake elements.

In one embodiment of this invention, the programmable microprocessor is used for the aforementioned purpose of timing brake element activation and deactivation to achieve proper force (moment or torque) versus displacement (rotation) characteristics for proper operation of the walk-assist device as described above. The brake element activation and deactivation timing is based on one or more of the aforementioned joint angle and/or body acceleration sensory information.

In another embodiment, the programmable microprocessor is used for the aforementioned purpose as well as for adapting to the variations in the walking pattern, walking up and down stairs, walking up or down an inclined surface, etc.

In another embodiment, the programmable microprocessor is used for one or both of the aforementioned purposes as well as allowing the user to adjust the control parameters and the brake element activation and deactivation sequencing to increase or decrease the effectiveness of the walk-assist device in reducing the amount of work that is done by the muscles during walking or running in order to allow the muscles to get certain amount of exercise.

The role of the aforementioned programmable microprocessor and the control unit in other embodiments is described below.

In an alternative embodiment, manual or automatic gearing and/or cam mechanisms, similar to a gear on a bicycle, is used instead of programmable microprocessor based control unit to adjust the pattern and level of forces (moments and torque) generated by the passive elements so as to provide the desired level of assist and match it to the changing pattern of walking or running, such as moving up or down a sloped surface or stairs.

In FIGS. 19b and 19c, the elements 210 and 211 are shown to have a finite, even though preferably small, size. However, the elements 210 and 211 are preferably very small and a relatively large number of them used in the construction of walk-assist devices, and as such act as quasi-distributed brake and clutch systems. Such quasi-distributed brake and clutch systems could be constructed using active materials such as piezoelectric films and fibers and magnetorheological fluids.

In the above embodiments, power activated brake elements such as the element 197 is used to engage or disengage the walk-assist device by isolating the spring elements of the system such as shown in FIG. 20b. In FIGS. 20b, 191 and 192 are the aforementioned components that are connected to the walk-assist device to allow deformation of the spring element 195 during its operation. By positioning the brake element 197 in series with the spring element 195, the spring element 195 can be isolated by deactivating (disengaging) the brake element 197.

In the embodiment shown in FIG. 20b, however, a power operated engagement/disengagement clutch is used for the aforementioned purpose instead of brake element 197, partly to minimize electrical power consumption. In general, whenever possible, engagement/disengagement clutches are preferable to braking elements. However, when smooth transition from the engaged to the disengaged states is desired, brake elements are preferable since the applied braking force can be regulated. In addition, braking elements can also be used to limit the transmitted force unlike clutches with positive engagement/disengagement mechanisms.

In the embodiment shown in FIG. 20b, the brake element is replaced with a manually operated engagement/disengagement clutch, which are well known in the art. This is particularly suitable for walk-assist devices with partly or wholly passive elements.

In the above embodiments, spring elements are directly and without intermediate mechanisms to store mechanical energy to be absorbed by the walk-assist device and return it in the same manner to the leg system. The mechanical energy may, however, be directed to the spring element via a certain mechanism, such as a ratchet type of mechanism for the purpose of storing energy during several cycles of gate and releasing it at a desired portion of the stride, or once a desired level of potential energy is stored in the spring, or as programmed in the microprocessor control unit. The higher levels of potential energy may be required to increase the efficiency of the device receiving the released potential energy, such as the efficiency of a boot integrated cooling device.

In this section of the disclosure, the present method and related devices are described as applied to one joint of the lower extremity, across two or more joints, or across all the joints of the lower extremity. It is readily seen by those skilled in the art that the proposed walk-assist devices can be designed to cover both lower extremity and interconnected to provide added stance stability and transfer energy from one leg to the other to further reduce the "locomotion energy" and the "stance energy". Such walk-assist devices can be equipped with the aforementioned active elements and their operation is controlled by programmable microprocessors.

Methods and Devices to Generate Electrical Energy while Reducing Fatigue

Various devices have been made to allow a human to generate useful electrical power. The most common such device is the bicycle dynamo that is brought into contact with the tire to generate electrical energy to power lights and certain other electrical and electronic devices. Dynamos rotated by hands through a handle have been used for various purposes including for powering fielded communication devices. In recent years, attempt has also been made to generate electrical energy during walking, for example by incorporating piezoelectric elements directly or through other mechanical devices in the sole of the shoes to utilize pressure exerted by the weight of the subject to deform an elastic element or pressurize certain fluid and use the stored potential and/or kinetic energy to generate electrical energy.

However, in all the methods considered to date for generating electrical energy by a human subject, the subject has to spend energy to produce the mechanical energy that is used by the energy conversion device or system. As a result, the subject becomes tired, particularly if power has to be generated over a considerable amount of time. In addition, due to the inherent inefficiency of all energy conversion systems, the subject has to spend a significantly higher amount of energy than is produced by the energy conversion system. This is the primary reason why such power generation methods and developed devices have not found widespread usage, except for extremely low power levels such as very low power implanted sensors and devices, and for emergency situations.

In this disclosure, methods are presented for generating electrical power by a human subject while participating in a variety of activities such as walking or running. The primary difference between the disclosed methods and all other currently available methods is that with the methods disclosed herein, a subject can generate electrical power while walking or running, while at the same time reducing his/her fatigue by reducing the aforementioned "locomotion energy". In other words, a subject using a power generating device based on the disclosed methods can generate electrical energy while walking or running, while at the same time saving energy, i.e., getting less tired than he/she would have become if he/she were not wearing the device.

The electrical energy generating devices constructed based on the disclosed method can be attached to one or more of the joints of the lower extremities. These devices would preferably be similar to low profile braces worn on the knee, ankle or the hip joints. The size of each device is related to the amount of available mechanical energy at the joint and the amount of electrical power that needs to be produced. For example, for low power requirements, the device may closely resemble an elastic joint support, that is worn under the garment. The preferable joints for such devices are the knee joint for low power requirements and the ankle joint for higher power requirements. This is generally the case since for the knee joint, the device could be built as a knee pad, and for the ankle joint, the device could be built into a boot (or shoe). For maximum electrical power generation, the aforementioned walk-assist mechanisms that interconnect all the lower extremity joints can be used. The mechanical to electrical energy conversion may utilize piezoelectric polymers or fibers, coil and magnet, or any other similar energy conversion components.

In the following segment of this disclosure, the present methods are described by their application to an electrical energy generation device for a human ankle joint, which allows the user to generate electrical energy during walking while at the same time getting less tired. However, the method is general, and can be used similarly to construct devices for other joints, such as the knee or hip joints or to be used with the aforementioned walk-assist devices that interconnect all the lower extremity joints. The method also applies to other periodic linear and/or rotational motion of other segments of the body during walking or running. For such periodic linear and/or rotational motions, devices that operate in a manner similar to those for the lower extremity joints can be constructed to generate electrical energy while reducing the amount of mechanical energy that the related muscles have to provide.

For the ankle joint, the plots of FIGS. 4, 7 and 8 were shown to indicate that the muscles acting at the ankle joint have to do work to absorb potential and/or kinetic energy of the leg in the range A to B, FIGS. 4 and 7, corresponding to the range P6 to P9 along Arrow 120 in FIG. 8, of the stride. The muscles acting at the ankle joint also work to increase the potential and/or kinetic energy of the leg in the range B to C, FIG. 4, corresponding to the range P9 to P15, FIG. 8, of the stride. It was shown that the area under the joint angle versus joint moment curve from point P6 to point P9 and the zero moment $(M_A)$ line is the aforementioned work (referred to as $W_{ab}$) that the leg muscles have to do to absorb the kinetic and/or potential energy of the leg during the corresponding portion of the stride. The area under the above curve from point P9 to point P15 and the zero moment $(M_A)$ line is the aforementioned work (referred to as $W_{add}$) that the leg muscles have to do to add kinetic and/or potential energy to the leg system during the corresponding portion of the stride.

Similar intervals were also shown for the knee joint in FIG. 2d. As can be seen in FIG. 2d, there are three intervals, labeled as N1, N2, N3 and N4, within which the input power is negative. During these intervals, the leg muscles, as a whole, are absorbing energy and the knee torque (moment), FIG. 2c, and angular velocity, FIG. 2b, are in opposing directions.

The net mechanical work done by the muscles acting on the knee joint to absorb the energy during each of the N1, N2 and N3 intervals is determined by equation (2) for the time interval $t_1$ to $t_2$, $t_3$ to $t_4$ and $t_5$ to $t_6$, respectively, and are given in Table 1. The internal N4 is relatively small and is not included in Table 1. As can be seen in Table 1, the right leg muscles absorb a total of approximately 250 mJ of energy during each stride. The amount of energy absorbed by the leg muscles acting on the ankle joint can be similarly determined.

TABLE 1

Work Done to Absorb Power at the Knee

| Interval | Time interval | Work (mJ) |
| --- | --- | --- |
| N1 | $t_1$-$t_2$ | 55.4 |
| N2 | $t_3$-$t_4$ | 85.1 |
| N3 | $t_5$-$t_6$ | 110 |

From the data presented in Table 1, the walking subject is seen to need to spend 250 mJ of energy in the time interval $t_1$ to $t_2$, $t_3$ to $t_4$ and $t_5$ to $t_6$ by the muscles acting on the knee joint to sustain gate. This energy is spent for the purpose of absorbing kinetic and potential energy of the leg. The electrical energy generation method being disclosed is based on providing external means to absorb this energy rather than requiring the subject to spend energy via the leg muscles.

In one embodiment, such an external device is attached to the leg at the knee joint, and transforms the aforementioned mechanical energy into electrical energy using an appropriate mechanical to electrical energy conversion system such as a magnet and coil or an appropriate piezoelectric based mechanism.

In a similar manner, the kinetic and/or energy to be absorbed by the muscles acting at the ankle joint during the portion of the stride from point A to point B, FIG. 4 (corresponding to the range P6 to P9 along the arrow 120 in FIG. 8), can be transformed into electrical energy using a similar external electrical power generating device.

When the energy to be absorbed by the leg muscles is absorbed by an external means such as the disclosed electrical power generating system, the walking subject has to spend less energy and is thereby less fatigued during walking.

In general, one may not want to convert all the available mechanical energy to electrical energy. The remaining mechanical energy is then stored in the aforementioned "locomotion energy" reducing devices to reduce the required locomotion energy as previously described. Thus, the methods and devices disclosed here can reduce fatigue as wells as generate electrical energy. This is particularly useful in light of the fact that the amount of electrical energy that is generally needed by handheld electronics devices is much less than the total mechanical energy to be absorbed by the leg muscles during walking. Therefore in most situations, only a portion of the aforementioned mechanical energy needs to be converted to electrical energy. Secondly, partial conversion of the available mechanical energy to electrical energy can be achieved using a very simple conversion system as described below. Lastly, the unused portion of the available mechanical energy is not wasted but used to reduce the locomotion energy as was previously described.

It is noted that walk-assist devices may be constructed with only the energy absorbing components. Such devices would only reduce or eliminate the need for the muscles to work to absorb the aforementioned kinetic and/or potential energy of the leg during walking and running. In other words, such walk-assist devices, unlike the aforementioned "locomotion energy" reducing walk-assist devices, do not store and return the absorbed mechanical energy to the limbs. The absorbed energy is, however, available for other uses, e.g., for generating electrical energy as previously described. For this reason, hereinafter, this method of constructing walk-assist devices is referred to as the "energy dissipative" method. A number of embodiments of such walk-assist devices are provided below.

In one embodiment of such a device, the mechanical energy-absorbing element is an electrical energy generator.

In another embodiment of such a device, the mechanical energy-absorbing element transforms the mechanical energy into heat using, for example, a braking device.

In yet another embodiment of such a device, the mechanical energy-absorbing element transforms the mechanical energy into another form of mechanical energy such as potential energy of a pressurized fluid or kinetic energy of a flywheel. The pressurized fluid may then be used to run a microturbine to generate electrical energy or the like. The kinetic energy stored in the flywheel may also be used for similar purposes.

In yet another embodiment of such a device, the mechanical energy-absorbing element transfers the energy directly to another energy consuming system such as a personal cooling system. In one embodiment, the entire system is integrated into the subject's boots. In another embodiment, the head, and/or the upper body are cooled with the disclosed system. When the source of cooling is positioned relatively far from the intended cooling region, for example if the cooling system is integrated into the boots and the head is intended to be cooled, then it may be more efficient to convert the mechanical energy first to electrical energy and then use electrical energy to cool the head using solid state cooling or the like. In yet another embodiment, drinking fluid or food is cooled by the system.

In yet another embodiment of such a device, the mechanical energy-absorbing element transfers the energy directly to another energy consuming system such as a personal heating system, particularly for warming the most vulnerable limbs such as feet and toes, hands, etc.

In yet another embodiment of such a device, the mechanical energy-absorbing element is a combination of two or more of the aforementioned elements. In one embodiment of such a device, a control (switching) unit is provided to either regulate the amount of energy transferred to each element, e.g., to keep the body at certain temperature. The control unit is preferably operated by a programmable microprocessor.

The above embodiments provide walk-assist devices that besides providing the intended benefits, for example heating or cooling the body, they would also reduce the user fatigue by reducing the amount of muscle work that the user has to perform.

Similar to the aforementioned embodiments for power generation, one may not want to transfer all the available mechanical energy to the above elements (brake, cooling, heating, etc. elements). In which case, the remaining mechanical energy is then stored in the aforementioned "locomotion energy" reducing devices and used to reduce the required locomotion energy as previously described.

Figure 22:
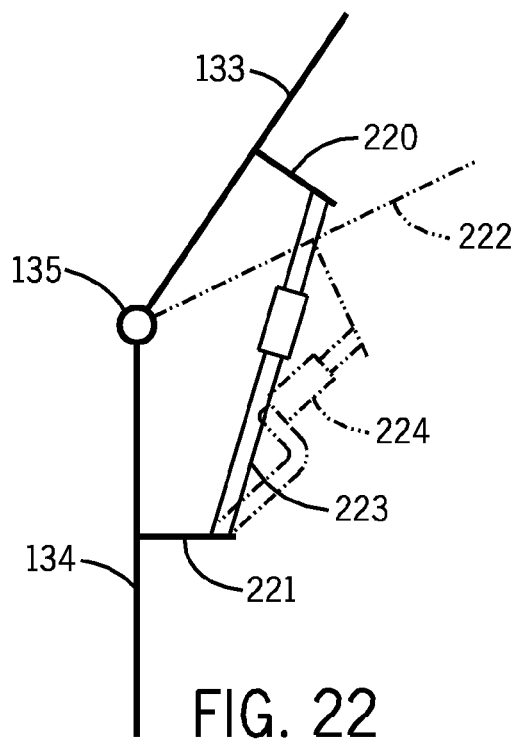
FIG. 22 illustrates an embodiment of a power generating walk-assist device.

The aforementioned power generating walk-assist embodiments is described first for a walk-assist device mounted at the ankle joint similar to that of FIG. 9. The links 133 and 134 are still joined by the rotary joint 135 and are fixed to the leg cuff 132 and the foot piece (shoe) 131, respectively. In FIG. 22, the links 133 and 134 are shown alone. The links 133 and 134 are provided by structural means for attaching the power generating elements, in this case by stems 220 and 221, respectively. In an embodiment, an elastic element 223 (band, strip, spring, etc.) is used to connect the stems 220 and 221. At some point along the element 223, an electric power-generating device 224, the operation of which is described later in this disclosure, is mounted. The characteristics of the elastic element 223 and its free length are selected according to the aforementioned procedure described for the "locomotion energy" reducing walk-assist devices. The length of the elastic element allows it to become loose (no tension) at the link 133 position 222 and onward as the link 133 is rotated clockwise, thereby providing no resistance to the ankle joint rotation (this range starts from around the point P6 to P5, continuing to point P15, as shown in FIG. 8). However, starting from the point P6, the elastic element 223 becomes taut (shown in broken line), and as the link 133 is rotated counterclockwise, the elastic element provides a moment about the ankle joint, which would in the best possible situation, follow the ankle joint angle versus moment curve shown in FIG. 8 from the point P6 all the way or part of the way to the point P9 in the direction 122.

Figure 23A:
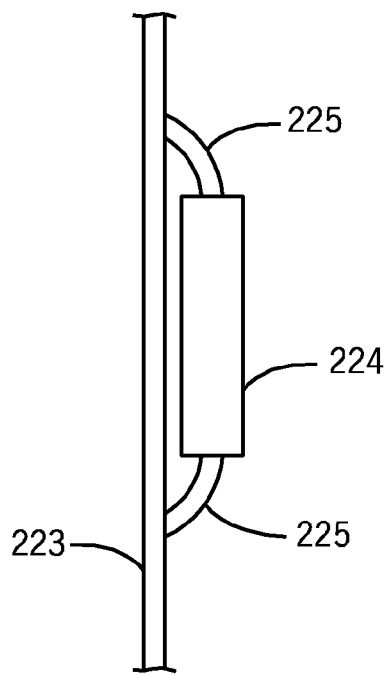
FIGS. 23a and 23b illustrate a piezoelectric material based power-generating element.
Figure 23B:
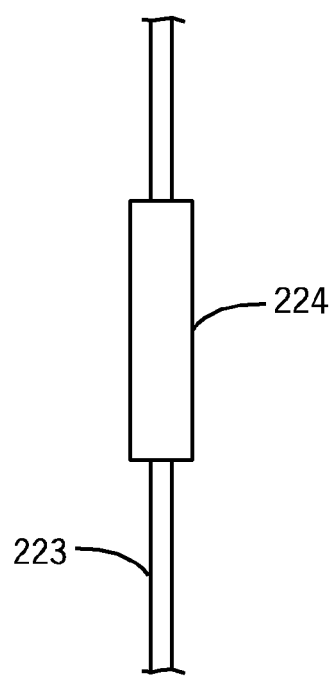

In one embodiment of this invention, the power-generating element 224 is constructed using piezoelectric materials. One such piezoelectric material based power-generating element 224 (hereinafter, referred to as the piezo generator) is shown in the schematics of FIGS. 23*a* and 23*b*. In FIG. 23*a*, the piezo generator 224 is attached to the elastic element 223 with a parallel configuration by the attachment means 225, which can be made out of the same elastic material as elastic element 223. In FIG. 23*b*, the piezo generator 224 is attached in series to the elastic element 223. In general, the effective spring rate of the piezo generator 224 is desired to be close to that of the elastic element 223 to maximize the amount of mechanical energy to be converted to electrical energy by the piezo generator 224. It is noted that by applying tensile or compressive stress to a piezoelectric element, a charge is generated that could then be harvested by well known electronics circuits and stored in capacitors or used to charge rechargeable batteries. During each cycle of stride, the mechanical energy that is not converted to electrical energy is returned to the leg system to reduce the work of the muscles while they need to increase the kinetic and/or potential energy of the leg system.

Figure 24A:
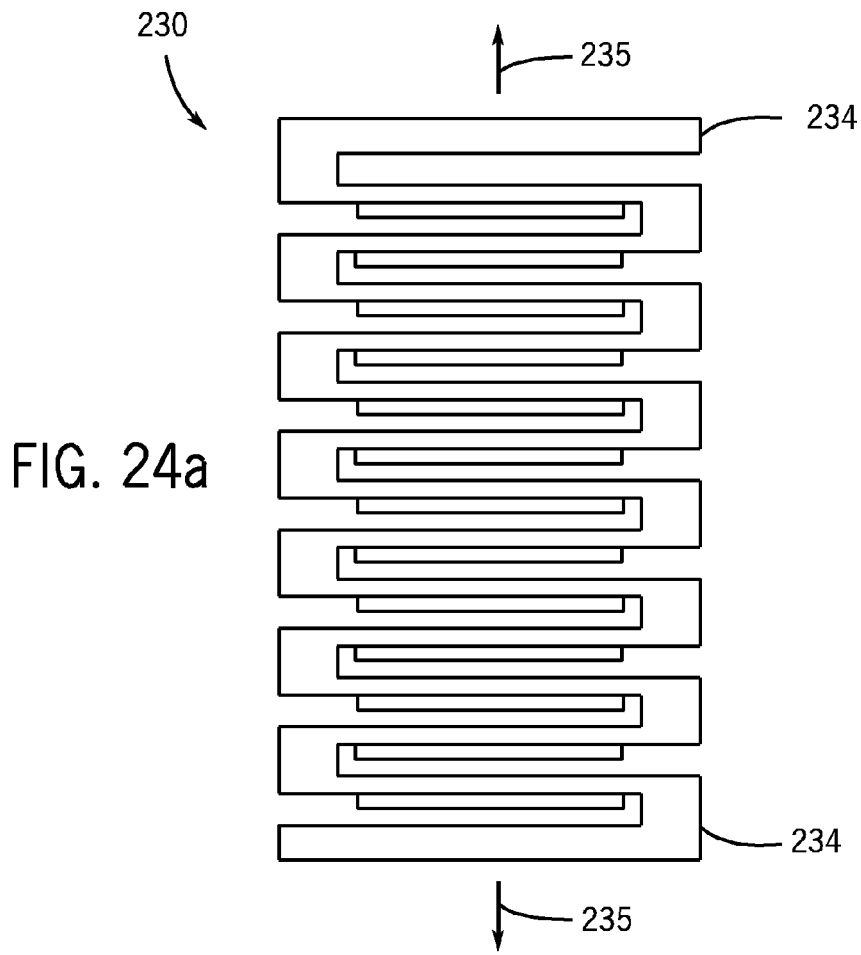
FIG. 24a illustrates a schematic of a piezo generator.

The piezo generator may be a stacked type; a thin film type with a flexible backing; fiber type, particularly of the type that are formed to significantly increase allowable elongation; made as a stack 230 of bending beams as shown in FIG. 24*a*, with each beam covered by a sheet of piezoelectric material; or any other numerous configurations that are known in the art. In general, the piezoelectric elements must be prevented from being subjected to a considerable amount of tensile force since they are fairly brittle and could easily be fractured. This can be done by the design of the piezo generator or by preloading said elements in compression to a level that with the applied tensile force the element still remains under compressive loading.

Figure 24B:
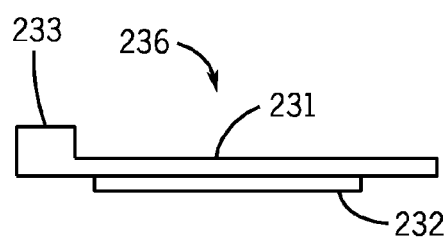
Figure 24C:
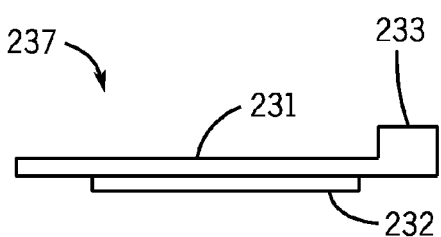

The piezo generator embodiment 230 shown schematically in FIG. 24*a* is designed to subject piezoelectric elements (preferably in thin strips) to compressive loading achieved through bending. Each piezo generator 230 is constructed with basic bending elements 236 and 237 shown in FIGS. 24*b* and 24*c*, respectively. Each element 236 and 237 consists of a relatively long bending beam 231, over which a strip of piezoelectric material is bonded using preferably a thin layer of relatively stiff epoxy or other similar bonding agent. In one embodiment, the bonding material is conducting and forms one of the electrodes of the piezoelectric strip element as described below. Each of the beam elements 231 are provided with steps 233 that extend above the surface of the piezoelectric strips 232. The difference between the two bending elements 236 and 237 is the position of the step, for the element 236 the step 233 is on the left side and for the element 237 the step 233 is on the right side, FIGS. 24*b* and 24*c*, respectively. The two elements 236 and 237 are preferably symmetrical so that one would only need to be rotated to form the other. The elements 236 and 237 are then stacked, one on the top of the other, to form the basic assembly of the piezo generator 230, FIG. 24*a*. The stacks are attached by attaching one step 233 to the appropriate surface of the other beam as shown in FIG. 24*a*. The steps may be attached to the beams by fasteners, adhesive bonding, or any other available method known in the art. In one embodiment, the step and the beam are attached by sliding one into a provided guide (e.g., a dove tail or square shaped type—not shown in FIGS. 24*a*-24*c*), which are preferably locked by an appropriate bonding material such as epoxy. In another embodiment, the beams and steps are constructed from a single strip of beam material, preferably aluminum. The piezoelectric strips 232 are first bonded at appropriate positions and then bended into the form of the piezo generator 230. The steps 233 may also be eliminated to simplify the parts and the bending process. However, noting that one of the functions of the steps in 230 is to make the ends of the deflecting beams more rigid, thereby maximizing the amount of the bending of the beams in areas that are covered by the piezoelectric strips. This function may, however, be provided in the case of a strip of beam material with uniform thickness (without the step 233), for example, by making the bent areas wider, thereby stiffer.

Figure 25:
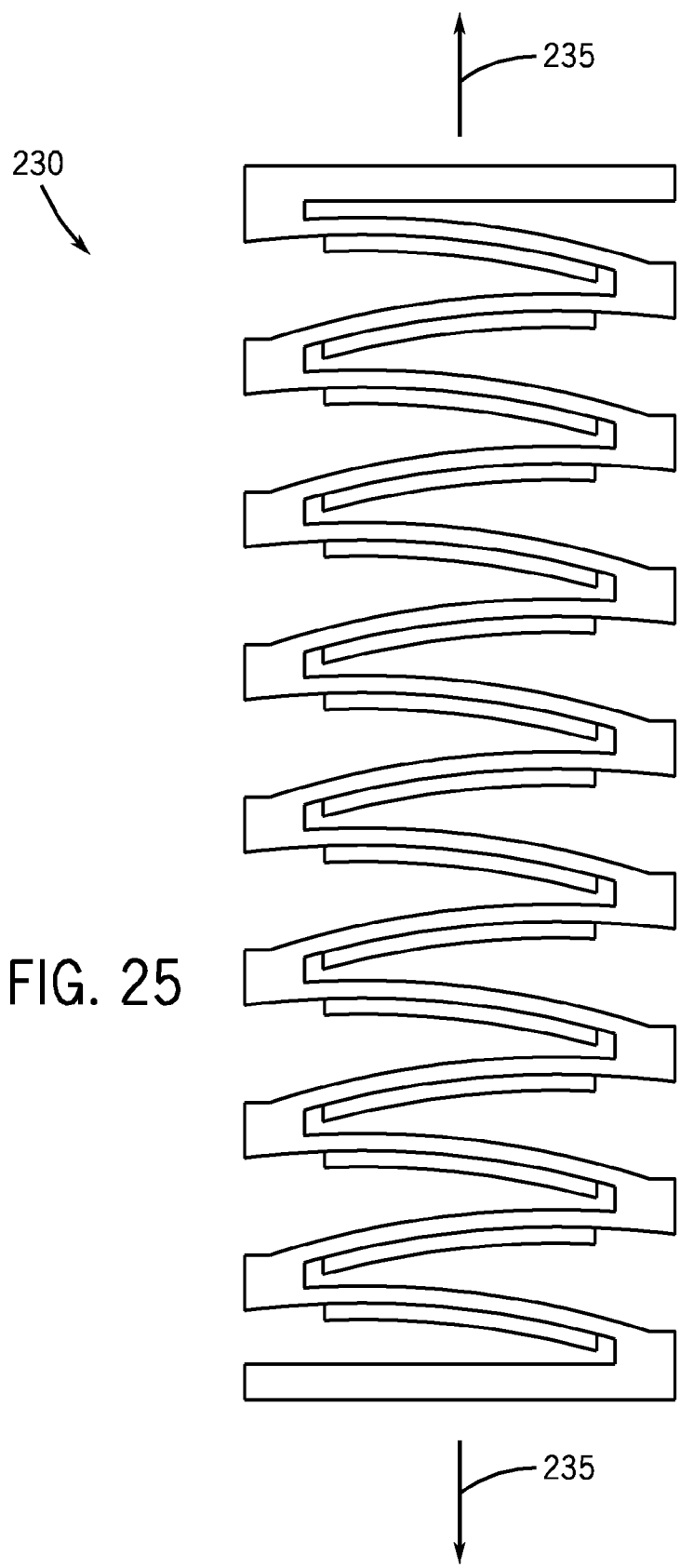
FIG. 25 illustrates a schematic of the piezo generator of FIG. 24a under an applied pair of tensile forces.

During walking, as the elastic element 223, FIG. 22, is stretched, the piezo generator is stretched, and a pair of forces 235 are applied to the piezo generator 230, subjecting the beams 231 to bending, thereby subjecting the outer layer of the beam, i.e., the piezoelectric strip to compressive stress. The piezoelectric strips would thereby produce a voltage and charge, which can then be harvested as described below. The schematic of the piezo generator under the applied pair of tensile forces 235 (provided by the elastic elements 223, 225) is shown in FIG. 25. In general, the piezoelectric strip is preferably preloaded in compression to avoid subjecting it to tensile forces. To make the attachment of the piezo generator to the elastic elements 223 or 225 or any other element, relatively rigid end pieces 234 can be provided.

Under the applied pair of tensile forces 235, the beam elements 231 bend as shown in FIG. 25, thereby allowing the total length of the piezo generator 230 to increase. The total amount of work done by the force 235 over the elongation of the piezo generator length is equal to the maximum amount of energy that is ideally available to be harvested. However, a considerable portion of the available mechanical energy is stored in the beam elements and other structural elements of the piezo generator 230 and the piezoelectric strips as strain energy, and is not available as electrical charge for harvesting as electrical energy. For the case of the beams and connecting structures of the piezo generator 230, the aforementioned strain is due to the deformation pattern of the whole structure as a spring. The piezoelectric strips, as deformed, act as part of the structure of the piezo generator 230 to resist the applied load. The deformation of the piezo generators would also induce internal charges that tend to increase the resistance of the piezoelectric strips to the aforementioned deformation, thereby making them effectively stiffer. The amount of work that the applied forces 235 have performed to overcome the aforementioned internal resistance of the piezoelectric strips is the amount of energy available for harvesting. In general, the rule of thumb is that when an external force deforms a piezoelectric element, about one-third of the work done by the external forces is stored as electric potential in the piezoelectric element, i.e., about one-third of the input mechanical energy could be harvested as electrical energy. Using the same rule of thumb, during each cycle of stride, less than one-third of available mechanical energy stored in the piezo generator 230 is available for conversion into electrical energy. It can therefore be observed that in the ideal situation, the beam and connecting structures of the piezo generator 230 are desired to provide minimal resistance to deformation as a result of the applied forces 235, thereby transferring maximum mechanical energy to the piezoelectric elements.

Figure 26:
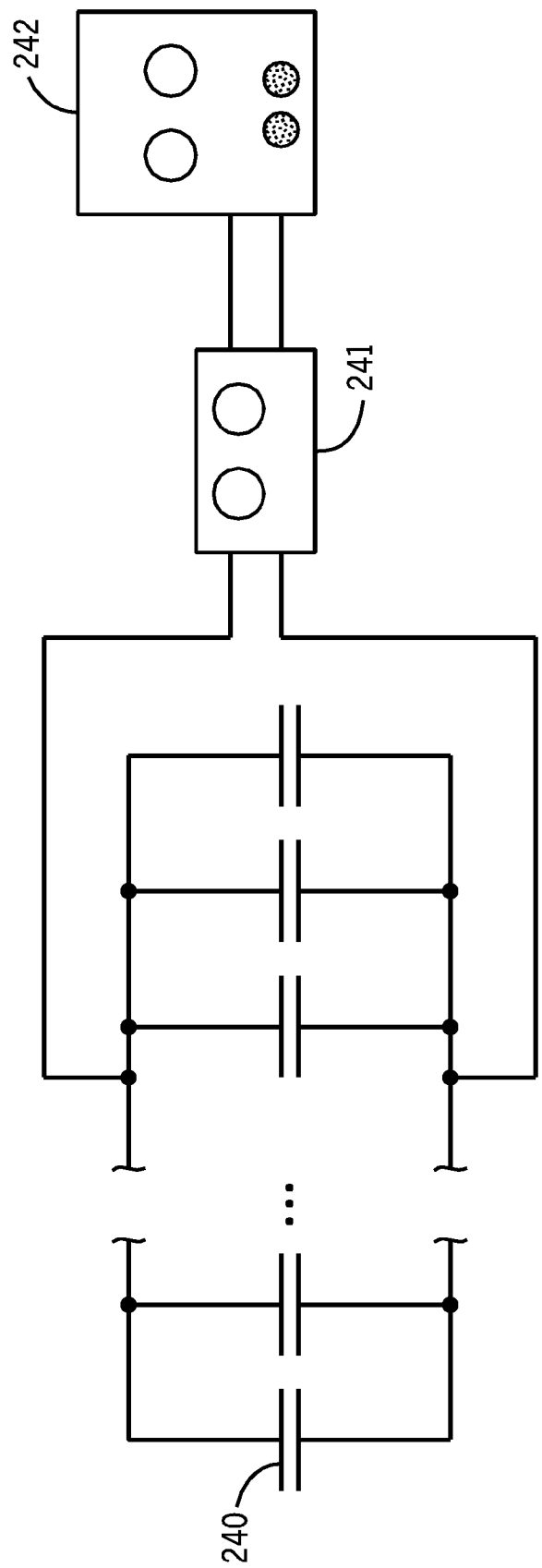
FIG. 26 illustrates a schematic of an electric power generator and its electrical energy collection and regulation electronics.

The agent bonding the piezoelectric strips 232 to the beams 231 is preferably very thin and has stiffness similar to that of the beam 231 and has low damping so that the strain on the beam surface is efficiently transmitted to the piezoelectric strip 232. The piezoelectric strip is preferably poled such that as a result of compressive stress along the length of the strip, charge is produced on the two surfaces of the strip, where the conducting electrodes are positioned. In one embodiment, the bonding agent is conductive, and thereby makes the beam structure as the conducting medium connecting one of the electrodes of a bank of piezoelectric strip elements together in parallel, this method of wiring such electrical power generators provide relatively high voltage output. Conductive bonding agents such as epoxy are commonly used in practice. The electric power generator and its electrical energy collection and regulation electronics can then be configured as is common practice in the art, such as shown in the schematic of FIG. 26. In FIG. 26, each piezoelectric element is shown schematically as a capacitor 240, neglecting other smaller effects such as resistance, etc. The capacitors are shown to be connected in series, even though they could be wired in series or partly in parallel and in series in various configurations, depending on the number of piezoelectric elements and their capacitance in each particular case, and depending on the electrical energy collection and regulation element 241 and the storage device 242, which could be capacitive, a rechargeable battery or their combination. Alternatively, the electrical energy collection and regulation element 241 may direct all or part of the collected electrical energy to some terminal electrical or electronics loads (not shown) such as lighting, communications devices, heating elements, etc.

It is noted that piezoelectric elements may be constructed in a variety of configurations, a number of which could be used to design piezo generators similar to the element 230, in particular when the objective is not to maximize electrical power generation of the walk-assist device. It general, however, it is noted that to maximize the amount of the electrical energy that could be generated, the piezoelectric elements can provide nearly the same amount to the stiffness of the piezo generator 230. Similarly, the piezo generator 224 can provide nearly the same amount to the equivalent spring rate of the assemblies shown in FIGS. 23a and 23b as the elastic element 223.

In the assemblies of FIGS. 23a and 23b, an elastic element 223 is assembled in parallel or in series with a piezo generator 224. Alternatively, at least one piezo generator such as element 224, may be configured with at least one element 210 and/or at least one element 211, FIGS. 19b and 19c, with or without other elastic (spring) elements, for use in place of the elements 223 and 224 in a walk-assist device provided at one joint of the subject, FIG. 22, or in the aforementioned assemblies connecting more than one lower extremity of the subject. The most appropriate configuration is dependent on each specific application. In a manner similar to that described for the "locomotion energy" reducing embodiments, a control unit equipped with a programmable microprocessor may be used to determine the sequence of activate and deactivate of the brake elements during walking. The programmable microprocessor also allows the user to vary the parameters of the control algorithm such as the rate of electrical power generation or turn it off completely. Some of the major related embodiments are disclosed below. However, it is appreciated by those skilled in the art that numerous other combinations are possible, each of which could provide slightly or significantly different characteristics.

Figure 27:
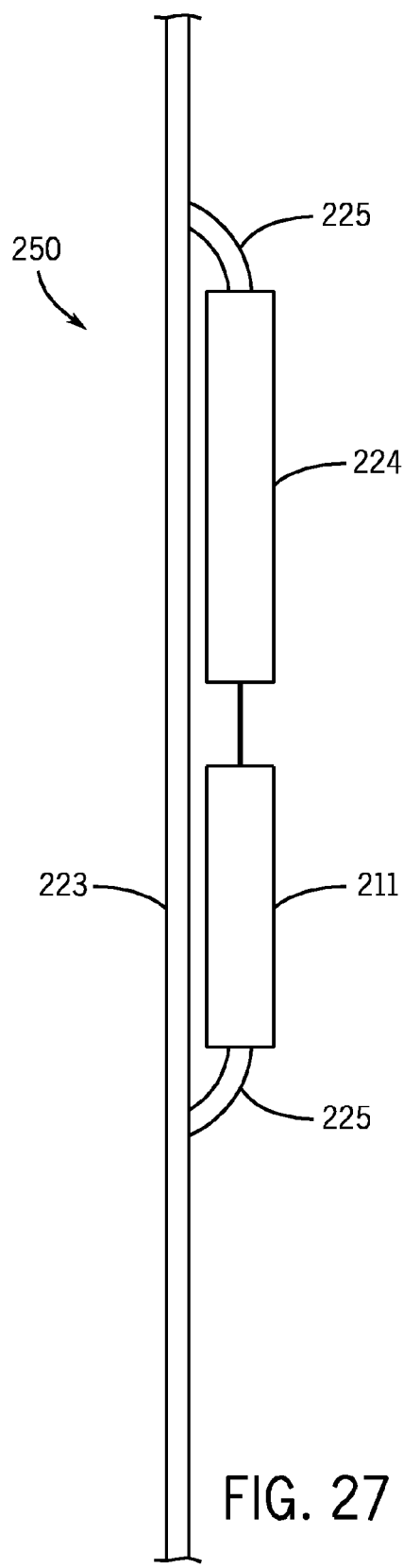
FIG. 27 illustrates a schematic of an elastic element and piezo generator element assembly with a brake element positioned in parallel with the power generator where the power generator is placed in parallel with the elastic element.

In one embodiment, the elastic element 223 and piezo generator 224 element assembly shown in FIG. 23a is modified with a brake element 211 positioned in series with the piezo generator 224 as shown in FIG. 27, and indicated as element 250. As a result, by activating the brake element 211, the generator is placed in parallel with the elastic element 223, and the assembly 250 operates as previously described for the schematic of FIG. 23a, i.e., as a power generating walk-assist device that reduces the required "locomotion energy". However, by deactivating the brake element 211, no power is generated and the device becomes a pure walk-assist device for reducing the "locomotion energy".

Figure 28:
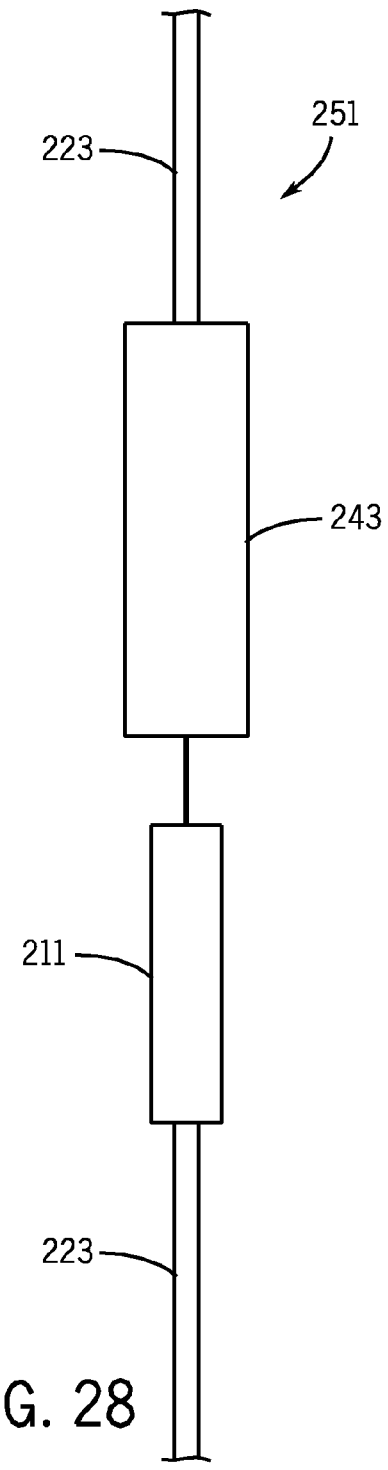
FIG. 28 illustrates a schematic of an elastic element and piezo generator element assembly with a brake element positioned in series with a power generator.

In another embodiment 251 shown in FIG. 28, the brake element 211 is positioned in series with a power generator 243. When the brake element 211 is activated, the power generator 243 is operated and generates electrical power. Otherwise the power generator 243 is deactivated. In walk-assist devices with passive elements only, manual engagement/disengagement clutches, a number of which are known in the art, can be used. Alternatively, power operated engagement/disengagement clutches, a number of which are known in the art, may be used instead of the brake element 211. The power generator 243 can be a dynamo type since if properly selected, it would allow the walk-assist device to operate at various speeds and its output can readily be controlled by the system programmable microprocessor to provide optimal resistance during walking and or running.

In yet another embodiment, another of the aforementioned devices, such as heating and or cooling elements are used in place of the power generator 243, FIG. 28, the operation of which could be controlled as described above with the system programmable microcomputer.

In the embodiments of the disclosed electrical power generating walk-assist devices that are used on isolated lower extremity joints such as the ankle or the knee joints, the device can be readily incorporated into wearable units already used widely for other purposes. For example, the electrical power generating walk-assist device used at the ankle joint is readily incorporated into the boots being worn by the subject. Or the electrical power generating walk-assist device for the knee joint can be constructed as a flexible knee bracing that, which strapped to the thigh and leg sides of the knee, which could also serve as a kneepad. In most of these cases, the mechanical to electrical energy conversion component of the electrical energy generator is preferably constructed with piezoelectric polymers or fibers to reduce complexity, weight and volume and make it resistant to impact loading.

All the aforementioned embodiments may be constructed to be adjustable, both in physical size so as to match different subject geometries and also in their operating characteristics, e.g., the level of power to be produced during walking or the amount of walk assistance it should provide. Such devices may be designed with a very specific task in mind, for example a knee brace type device might be designed for a hiker with a built-in GPS system. Or a device could be designed to power an MP3 player, while a person is rollerblading, etc.

Methods and Devices for Selective Exercising of Muscles

The aforementioned "locomotion energy" reducing walk-assist methods and related devices are based on storing the mechanical energy to be absorbed by the leg muscles as mechanical energy in elements such as springs, and providing it to the leg system when the leg muscles need to work to increase the kinetic and/or potential energy of the leg system. As a result, the total energy that the leg muscles have to spend during walking is reduced.

Now consider the situation in which the disclosed walk-assist device for reducing the "locomotion energy" is modified so that it would absorb energy while the leg muscles are doing work to increase the kinetic and/or potential energy of the leg system and that it inputs energy into the leg system while the leg muscles are required to absorb energy. The subject using the resulting device must then spend more energy to walk then they would without the device. As a result, the previously walk-assist device is turned into an exercise device and will hereinafter be referred to as an "exercise device" or a "muscle exercise device".

In a manner similar to the disclosed "locomotion energy" reducing devices, the "exercise devices" may be constructed for individual joints or for more than one joint, including as a mechanism worn on both legs, including the hip joints.

By wearing the "exercise device" on one particular joint and by selectively activating it during certain intervals of the joint(s) motions, one or a group of muscles are required to increase their work during walking and/or running, thereby turning the device into a selective "muscle exercise device" to strengthen a particular set of muscles or simply for aerobic purposes.

In one embodiment, the device is designed to absorb energy only while the leg muscles are doing work to increase the kinetic and/or potential energy of the leg system. The energy to be absorbed can be transferred to any number of elements, including those described in the electrical power generating walk-assist devices. For example, the energy to be absorbed is transformed into heat using braking or damping elements, or used to generate electrical energy, or used to run a cooling system, etc.

In another embodiment, the disclosed walk-assist device for reducing the "locomotion energy" is modified and a mechanical energy storage device such as a spring is used to absorb energy in the form of potential energy during the interval of the stride that the leg muscles are doing work to increase the kinetic and/or potential energy of the leg system. Then during the interval of the stride that the leg muscles are used to absorb mechanical energy to reduce kinetic and/or potential energy of the leg system, the potential energy stored in the aforementioned mechanical energy storage device is transferred to the leg system.

In yet another embodiment, the above two embodiments are combined such that energy is absorbed by transferring it partly to one of the aforementioned mechanical energy using devices such as electrical power generators and is partly stored as potential energy and transferred to the leg system while the leg muscles are working to absorb kinetic and/or potential energy from the leg system.

In yet another embodiment, energy may be absorbed during walking by providing energy absorbing elements in the shoes or boots (e.g., shoe sole or bottom surface utilizing bending deformation) to get exercise similar to walking and/or running on sand. The device can have means to adjust the rate of energy absorption. Such energy absorbing means include viscous or other friction elements used to generate heat, or other devices known in the art for heating or cooling the feet and/or some other segments of the body.

All embodiments of this invention can be equipped with programmable microprocessors that can be used by the user to activate or deactivate the exercising device; to select a particular muscle or a muscle group for exercise; and to increase or decrease the level of severity of the exercise. In devices equipped with mechanical energy absorbing elements that provide certain output, e.g., generate electrical energy or provide heating or cooling functions, such programmable microprocessor can be used to adjust their parameters. In another embodiment, manually operated engagement/disengagement clutches or other similar elements are used to activate or deactivate the exercising devices; select a particular muscle or a muscle group for exercise; or to adjust the level of exercise.

The methods and devices used to exercise selected muscles or muscle groups is described mainly with their application to the lower extremity joints, in particular the ankle joint. The disclosed methods are, however, general and applicable to the other joints of the body, both individually and as a group. The method also applies to other linear and/or rotational motion of other segments of the body that undergo nearly periodic motion during walking or running.

Figure 29:
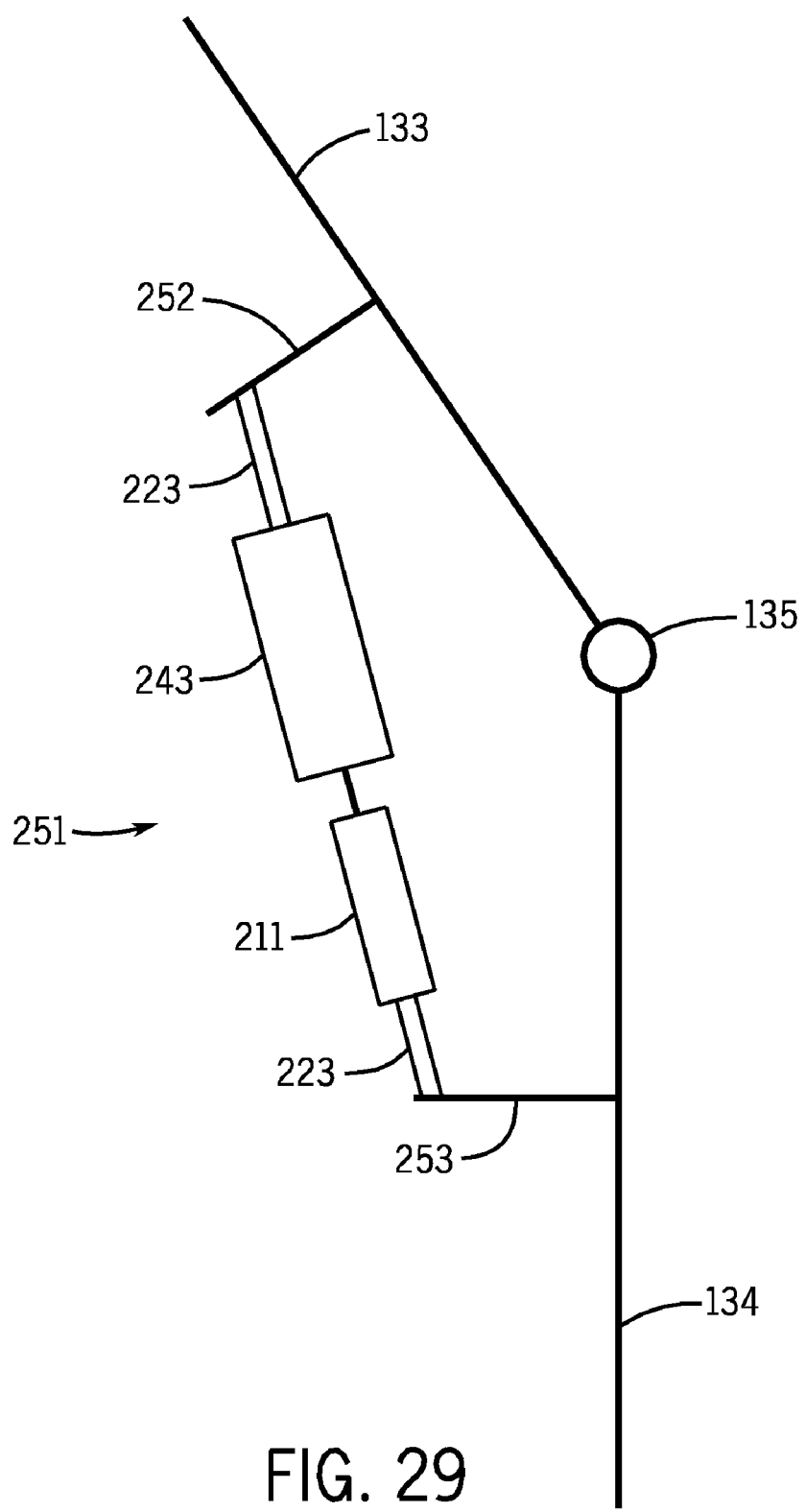
FIG. 29 illustrates a schematic of an embodiment of a device configured to exercise muscles.

Another embodiment illustrates how a walk-assist device for the ankle joint is modified into an exercise device. Consider the walk-assist device shown schematically in FIG. 9. In FIG. 29, the links 133 and 134 are shown alone. The links 133 and 134 are provided by structural means 252 and 253 for attaching a mechanical energy consuming element, in this case the assembly 251, FIG. 28. During walking, in the entire range of ankle joint motion except in the range corresponding to the ankle joint moment versus ankle joint angle curve from the point P9 to the pint P15 (during which time the muscles acting at the ankle joint are doing work to increase the kinetic and/or potential energy of the leg system), the brake element 211 is deactivated. In part or the entire range of ankle motion from the point P9 to the point P15, the brake element 211 is activated. As a result, during this phase of the stride, i.e., while the muscles are working about the ankle joint to increase the kinetic and/or potential energy of the leg system, the muscles have to work even harder to overcome the resistance of the mechanical energy consuming element, in this case the electrical power generator 243. Alternatively, other mechanical energy consuming elements such as cooling, heat generating elements such as viscous dampers or slipping brakes, etc., may be positioned together or instead of the electrical power generating element 243. The aforementioned programmable microprocessor control unit is preferably used to activate and deactivate the brake element 211, preferably based on a signal from an ankle joint sensor. The programmable microprocessor preferably allows the user to adjust the level of energy that is consumed by the mechanical energy consuming element by either varying the brake element 211 activation and deactivation timing, or by adjusting the parameters of the mechanical energy consuming element. The braking element 211 may be replaced by an engagement/disengagement clutch.

Such an embodiment is similar to the disclosed walk-assist device for reducing the "locomotion energy", such as those shown schematically in FIG. 9 or 13 for the ankle joint, except for the reversed action of the elastic mechanical (potential) energy storage elements. In this embodiment, the elastic elements are selected and positioned such that during the interval of the stride that the muscles are doing work to increase the kinetic and/or potential energy of the leg system, energy is also being transferred to the present device elastic element(s) as potential energy. And during the interval of the stride that the muscles are working to absorb the kinetic and/or potential energy of the leg system, the potential energy stored in the elastic element(s) of the device is returned to the leg system. As a result, during both of the above intervals of the stride, the leg muscles have to work harder to also supply potential energy to the elastic element(s) of the device, and later absorb the same potential energy.

Another embodiment is a combination of the above two embodiments. For the ankle joint alone, such a device is very similar to the embodiment shown in the schematic of FIG. 29, except that in place of the element 251, either one of the elements shown in FIG. 23*a*, 23*b* or 27 or elements with similar characteristics is used. The objective here is to return part of the available energy to the leg and transfer the remainder to a mechanical energy consuming element such as an electrical energy generating element.

Methods and Devices to Reduce "Stance Energy"

During locomotion, the weight of the subject body and the load that he/she is carrying (gravity generated loads) and the dynamics forces due to the inertia of the body and the load are supported partly by the muscle forces and partly by the resisting forces, moments (torques) across these joints, which are provided mostly by the passive components of the joints such as ligaments and other connective tissues and the contact forces between the condyles.

The motion across the joints of the lower extremities may be divided into two basic groups. The first group consists of the joint rotations with minimal connective tissue resistance except for minimal friction forces, such as the knee joint rotation 109 and the ankle rotation 121, FIG. 3. These joint rotations are hereinafter called the "unconstrained joint rotations". The remaining joint rotations and displacements (e.g., axial and shearing) are constrained, to various degrees, by the resistance of the connective tissues such as ligaments and the contact forces between the affected condyles. These joint rotations and displacements are hereinafter called the "constrained joint rotations" and "constrained joint displacements", respectively.

During walking, the required shearing, compressive and tensile forces across the "constrained joints", i.e., the forces required to stabilize the aforementioned "constrained joint displacements", and the required moments and torques about the "constrained joints", i.e., moments and torques required to stabilize the aforementioned "constrained joint rotations", are provided mostly by the ligaments and other passive connective tissues and the contact forces between the joint condyles. The ligaments and other connective tissues and the contact forces between the condyles provide the required resisting (stabilizing) forces, moments and torques across the "constrained joints" in response to the components of the aforementioned static or dynamic forces and moment and torques across these joints.

In normal conditions, the muscles generally contribute less to the aforementioned resistive or stabilizing forces, moments and torques. This is particularly the case when the forces generated by the muscles expanding across a joint do not provide a significant component in the direction of a "constrained joint displacement" or moment or torque about a "constrained joint rotation". The muscles, however, are used to provide additional moments to provide a margin of stability to the aforementioned "unconstrained joint rotations", and to a varying degree to the "constrained joint displacements" and "constrained joint rotations". Stabilizing moments about the "unconstrained joints" are also required to overcome static or nearly static forces during standing or during very slow walking such as walking with walkers, or while performing certain tasks while standing in place or moving very slowly, or the like. In general, while a subject uses his/her muscles to apply stabilizing moments across the unconstrained joints, the subject usually also applies stabilizing forces, moments and torques across the "constrained joints". Hereinafter, the work done by the muscles to provide the aforementioned stabilizing forces across both the unconstrained and the constrained joints of the lower extremities is called the "stance energy".

In the "locomotion energy" reducing embodiments, the disclosed "walk-assist" devices provide the means to reduce the required work of the muscles in providing moment about the aforementioned "unconstrained joints" during walking. The objective is to introduce methods and related devices for "walk-assist" or "stance-assist" devices that can be used to reduce the aforementioned "stance energy" during walking or during slow movements or standing still upright.

In general, the aforementioned "locomotion energy" reducing embodiments also help to reduce the "stance energy" in the following manner. The work that the muscles have to perform to increase the kinetic and/or potential energy during certain portions of the stride and then absorb the kinetic and/or potential energy during certain other portions of the stride include the work needed to support the weight of the body. Therefore the "locomotion energy" reducing embodiments also reduce certain amount of "stance energy" that the muscles have to provide. In addition, the potential energy storage elements, e.g., the elastic or spring elements, used in all "locomotion energy" reducing embodiments would resist a certain amount of rotation at the "unconstrained joints", thereby increasing stance stability and reducing the need for muscles to provide this portion of stabilizing moments about the "unconstrained joints". Here, only those embodiments are considered that do not use clutch and/or brake elements to isolate the above elastic and spring elements from the joint when the subject is not walking or running.

The basic method being disclosed for reducing "stance energy" is based on providing stabilizing moments about the "unconstrained joints" to at least support the weight of the subject, and preferably also supports the weight of the load that is being carried by the subject. In general, depending on the circumstances facing the subject, it might be desirable to provide more stabilizing moments than the required minimum to create a certain amount of stability margin. Similarly, it is sometimes desirable to provide certain amount of added stabilizing forces and/or moments and/or torques to the "constrained joints" of the subject. In general, all the above stabilizing forces, moments and torques are preferably nonlinear functions of their respective displacements and rotations, providing at least the minimum amount of stabilizing force, moment and torque about the preferred positioning of the joint, and increasing with an accelerated rate with deviation from such preferred positioning of the joint. This nonlinear characteristic of the stabilizing joint forces (moments and toques) are described in more detail in the remaining portion of this disclosure.

In general, the aforementioned "locomotion energy" reducing walk assist devices do also reduce the "stance energy" by a certain amount depending on their moment versus joint angle characteristics of the spring elements used to store and release potential energy during locomotion. With "locomotion energy" reducing walk-assist devices, a subject reduces "stance energy" during walking and running as well as while standing still or walking very slowly. This is the case since during walking, the spring element supports at least part of the subject weight and provides additional force, moment and torque across the "constrained joints". While standing still, the spring elements resist joint rotation to some extent as the "unconstrained joints" rotate away from the position at which, or range(s) of positions within which, the spring elements are designed not to provide resisting moments.

The above discussion applies to all the disclosed walk-assist embodiments for reducing "locomotion energy" that are constructed primarily with passive elements. For those embodiments that are constructed with braking (clutch) elements, including those that are operated by microprocessor-controlled, walk-assist devices that significantly reduce both the "locomotion energy" and the "stance energy", including "stance energy" during very slow walking or even while standing still, and that ensures stance stability with an appropriate amount of stability margin can be constructed as is described later in this section.

Figure 30:
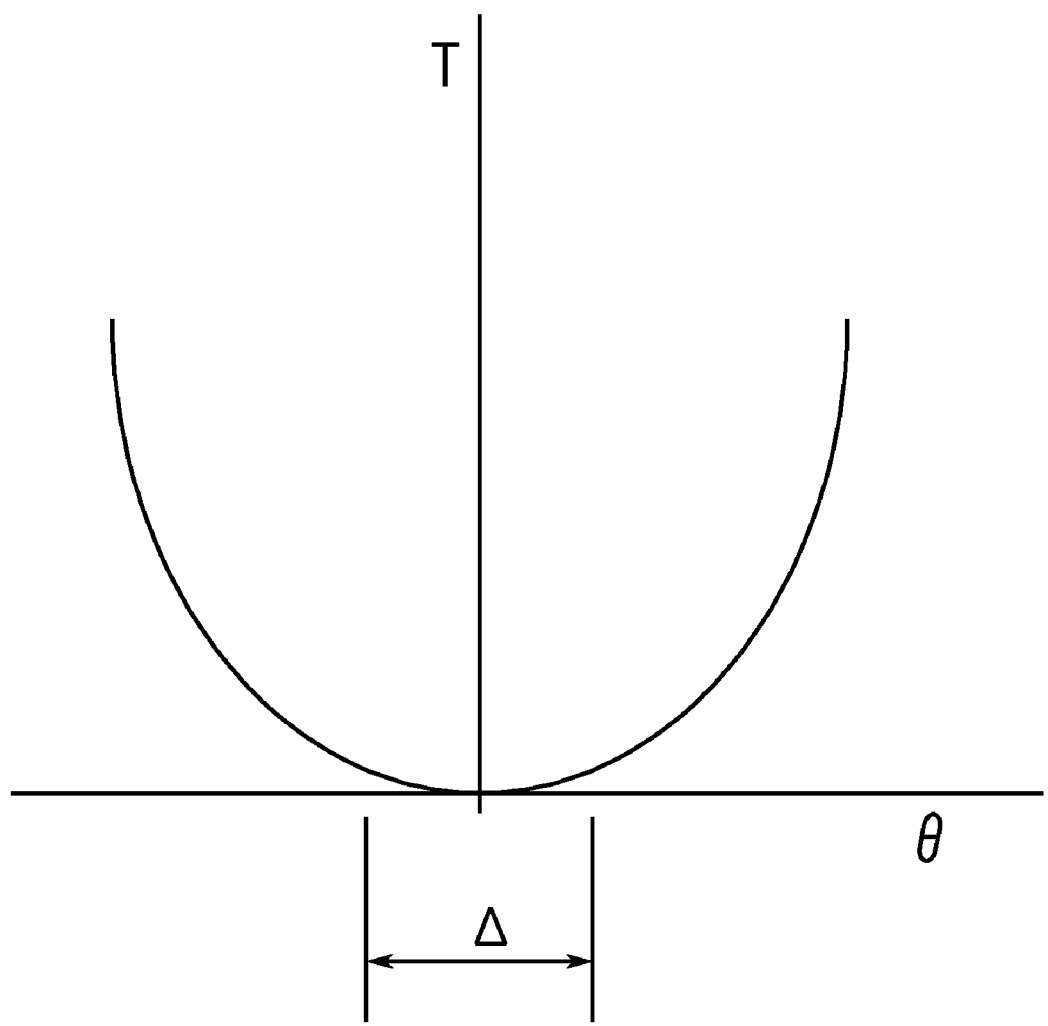
FIG. 30 illustrates a plot of moment (torque) $\tau$ versus angular rotation $\theta$ for a spring element.

In one embodiment of the above walk-assist devices constructed with passive elements, the springs are designed to produce nonlinear moment (torque) τ versus angular rotation θ characteristic similar to that shown in FIG. 30. The moment (torque) shown in FIG. 30 is in addition to the moment (torque) that in the previous section of this disclosure was shown to be required by the walk-assist embodiments for reducing "locomotion energy" and/or for utilizing the energy to be absorbed by the muscles to generate electrical energy or for some other purposes. The purpose of the added joint moment (torque) is to provide or increase stance stability during walking and running and/or as standing still or walking very slowly. As can be seen in FIG. 30, in certain range of joint rotation A, the added moment (torque) could be zero, but beyond that range (in one or both directions of rotation), the added moment (torque) is shown to increase with an accelerated rate. At relatively large angular rotations of the joint, the added moment (torque) becomes relatively large, thereby effectively stopping any further joint rotation in that direction. Such "maximum" allowable joint rotations may be manually adjustable.

In another embodiment, the "maximum" allowable joint rotation, the no moment (torque) range Δ, and even the shape of the curve are made adjustable utilizing the aforementioned brakes (clutches) and spring element assemblies, such as those shown in FIGS. 18-20 or disclosed previously. The adjustments may be done manually. A microprocessor controller with sensory inputs however, can also control the adjustments. Such sensory inputs could be accelerometers and/or gyros attached to the subject body or sensors measuring joint angles and their rates to predict an outset of stance instability.

In a variation of the above embodiment, the microprocessor control of the walk-assist device, particularly one that acts on all three joints of the leg, provides adjustments to the resisting moment (torque) at the "unconstrained joints" to provide support for the weight of the subject and to load being carried by the subject. The adjustment is preferably with input from a total weight-measuring sensor, such as one provided in the shoes or the boots. The subject using such a device can then carry a larger load while being assisted by the present walk-assist device during walking or running.

In yet another embodiment of the present invention, the aforementioned sensory input are used to predict outset of stance instability and make appropriate adjustment to the resisting joint moment (torque) to prevent the subject from suddenly falling or collapsing. In general, the stability is provided by an increase in the resisting joint moments (torques), eventually locking them in place to support the subject weight in a highly stable and comfortable posture. As such, the walk-assist device acts also as an emergency stance stability control device as well. Once the subject is in full control of the situation, he/she or someone assisting the subject would operate the microprocessor control with input(s) to allow the subject to regain full mobility, or be helped to sit or lay down, etc., by varying the resisting moment (torque) acting on the "unconstraint joints".

In all the above embodiments, the microprocessor control may be used to automatically adapt the walk-assist device to provide stance stability or increase in response to an input from one or more of the aforementioned sensors or sensors measuring parameters indicating fatigue, such as pulse rate, blood oxygen, EKG or the like. The microprocessor controller can be programmable to run various stored or input programs.

Methods and Devices for Rehabilitation

Almost all the walk-assist devices described in the previous sections can be readily turned into rehabilitation devices designed to perform one or more of the following tasks:

1. Reduce one or more of the "constrained joint" forces, moments or torque to reduce connective tissue and/or contact forces.
2. Reduce forces applied to one or a group of specific ligaments or other connective tissues.
3. Reduce condular contact forces, partially or entirely, at a lower extremity joint.
4. Reduce forces transmitted by one or a group of muscles acting across one or more of the lower extremity joints.
5. Reduce certain force, moment or torque that is transmitted across a limb, e.g., the leg or the thigh.
6. Provide the means to adjust the above joint, connective tissue, muscles and limb force, moment and torque.

The primary objective of the disclosed method and related devices is to affect forces, moments and torques that are transmitted across the lower extremity joints and/or limbs or their various components without significantly affecting the subject locomotion capabilities. This is generally done for therapeutic and/or rehabilitative purposes, or to allow locomotion in the presence of injury to one or more of the above, or following certain surgical procedures or the like. For this reason, it is highly desirable that the aforementioned reduction or increase in the joint, limb, connective tissue, muscle, etc., be adjustable. In this section of the disclosure, the present method is described by its application to one of the embodiments of the present invention.

In the most effective embodiment, an aforementioned walk-assist for reducing "locomotion energy" and "stance energy" with several active elements such as units 210 and 211 and with microprocessor control is modified as follows to provide the desired rehabilitative or therapeutic effect. The embodiment is described as employed on a single joint of the lower extremity. The disclosed embodiment can similarly be applied to devices covering two or more of the lower extremity joints.

In one embodiment, several spring and (brake) clutch elements and units similar to 210 and 211 are connected in parallel and/or in series as previously described and their actions are controlled by a microprocessor. The primary function of the microprocessor control unit is to activate and deactivate the brake and clutch elements so that the ranges of motion in which the device absorbs or provides energy to the leg system are selected such that the amount of force that a certain muscle or a group of muscles must apply (and tendons must bear) and/or the reaction forces at the condular surfaces of the joint, joint ligaments or other connective tissues. The method of reducing muscle forces during locomotion and stance was described above. The condular contact over the entire surface of the joint or a portion of it (e.g., on the lateral or the medial side) is generally reduced by allowing the walk-assist device to provide spring-generated loads on the appropriate side of the joint. For example, if condular contact on the lateral side of the knee joint is to be reduced, the walk-assist device provides appropriate amounts of spring force during each range of the joint motion. The condular contact forces may be similarly increased. The load across the joint ligaments and other soft tissues are similarly controlled.

In certain situations, the preloading of the spring elements of the above embodiment may have to be initially adjusted to allow the walk-assist device to provide the appropriate force levels during the entire cycle of the gate.

The rehabilitation devices disclosed herein can be controlled by a programmable microprocessor to achieve a prescribed pattern of muscle, tendon, ligament and condular forces. The force levels can then be varied over time to achieve the desired rehabilitative effects. In particular, such devices can be used for rehabilitation or for general muscle strengthening purposes. For example, such devices can be designed to allow a patient to reduce load on a specific joint or a muscle or a group of muscles or ligaments, with the potential of enabling a patient with injury to a hard and/or soft tissue to gain early mobility, and allow gradual increased loading of the injured members as they heal and as a means to enhance the healing process.

In an alternative embodiment, particularly if the walk-assist device does not have to vary the above connective tissue, contact force or muscle force patterns in a complex manner, for example if it only need to reduce the entire condular contact force or reduce the force transmitted through a specific ligament, then a walk-assist with only passive elements may suffice. In such walk-assist devices, the spring loads and preloading and other parameters of the device are preferably adjustable to match a wide range of adjustments.

Other Applications for the Disclosed Methods and Devices

The methods and devices disclosed in the previous sections can directly and with minor modifications be applied to certain sports activities to enhance performance or for training. For example, the aforementioned "locomotion energy" reducing method and devices can directly be used to reduce the energy spent during bicycling. The only modification needed is the adaptation of the joint moment (torque) versus angle characteristics from those of walking (e.g., FIGS. 2 and 4-8) to those of bicycling. In many sports, for example, cycling, swimming, rowing and the like, the disclosed "sport assist" devices are preferably passive. As it was shown previously in this disclosure, even totally passive devices could cover at least a certain portion of the activity cycle, thereby making a significant improvement in performance.

In one embodiment, the "sport assist" devices are designed to increase the performance of the user in bicycling.

In another embodiment, the "sport assist" devices are designed to increase the performance of the user in rowing.

In yet another embodiment, the "sport assist" devices are designed to increase the performance of the user in swimming.

In yet another embodiment, the "sport assist" devices are designed to increase the performance of the user in swimming under water with fins.

In yet another embodiment, the "sport assist" devices are designed to be adjustable so that its performance could be readily matched to the individual user.

In yet another embodiment, the "sport assist" devices are designed for exercising certain muscles and muscle groups important to a specific sport.

In addition, the walk-assist devices designed to reduce "locomotion energy" and "stance energy" and which span both legs of the subject may also be used to minimize or even eliminate the need for the leg muscle to do work during normal walking. Such devices can be designed with stance stability and allow input energy by powered actuation devices or preferably by the arms or muscles of the subject's upper body. In such devices, mechanical energy is readily transferred by the arms or upper body muscles by simply extending or compressing one or more of the potential energy storage springs of the walk-assist device. The aforementioned active elements can then be used to direct the stored potential energy to the required joints. The amount of mechanical energy needed from the external sources, the arms or the upper body muscles is minimal during walking on a flat surface, since the disclosed walk-assist devices for reducing "locomotion energy" and "stance energy" were shown to be capable of significantly reducing the need for work by the leg muscles. Such walk-assist devices are preferably equipped with the aforementioned active elements and their operation is controlled by programmable microprocessors to make them highly efficient. Such walk-assist devices will require a relatively small amount of input energy by the arms or the upper body muscles, and could be used by those who have minimal or even no use of their lower extremity muscles, and older people as a replacement for walkers of different types. In such applications, the walk-assist device is preferably equipped with the aforementioned sensor activated stance stability braking devices.

While there has been shown and described what is considered to be preferred embodiments of the invention, it will, of course, be understood that various modifications and changes in form or detail could readily be made without departing from the spirit of the invention. It is therefore intended that the invention be not limited to the exact forms described and illustrated, but should be constructed to cover all modifications that may fall within the scope of the appended claims.

What is claimed is:

1. A device for generating power during a locomotion cycle from mechanical energy of a living body, the device comprising an energy absorbing and converting device configured to be disposed across a joint of the living body, the energy absorbing and converting device configured to be selectively in an engaged state and in a disengaged state during selected portions of the locomotion cycle while the energy absorbing and converting device remains disposed across the joint of the living body;

wherein the device is engaged to absorb mechanical energy of the living body only during a portion of the locomotion cycle during which muscles of the joint would otherwise be doing work across the joint to absorb mechanical energy of the living body, the device is disengaged during a portion of the locomotion cycle during which the muscles are doing work across the joint to increase mechanical energy of the living body and the absorbed mechanical energy is at least partially converted to converted energy and the converted energy is provided to one of an energy storage device or power consuming device.

* * * * *